United States Patent

Tada et al.

[11] Patent Number: 5,548,890
[45] Date of Patent: Aug. 27, 1996

[54] LEAD FRAME PROCESSING METHOD

[75] Inventors: Nobuhiko Tada, Ushiku; Naoki Miyanagi, Ibaraki-ken; Yoshiaki Shimomura, Ibaraki-ken; Shigeyuki Sakurai, Ibaraki-ken; Shinya Okumura, Ibaraki-ken; Yoshinari Nagano, Ibaraki-ken, all of Japan

[73] Assignee: Hitachi Construction Machinery Co., Ltd., Tokyo, Japan

[21] Appl. No.: 553,742

[22] Filed: Oct. 23, 1995

Related U.S. Application Data

[63] Continuation of Ser. No. 256,476, Jul. 7, 1994, abandoned.

[30] Foreign Application Priority Data

Nov. 24, 1992 [JP] Japan .................................. 4-313615
Jul. 7, 1993 [JP] Japan .................................. 5-167940

[51] Int. Cl.$^6$ ........................ H01R 43/02; H01L 21/60; H01L 23/495; B23K 26/00
[52] U.S. Cl. .................. 29/827; 29/566.3; 216/14; 219/121.69; 257/666; 437/220
[58] Field of Search .................. 29/564.8, 566.3, 29/827, DIG. 7, DIG. 12, DIG. 16; 216/14, 65; 219/121.67, 121.68, 121.69, 121.75, 121.84; 228/180.1, 180.5, 201; 227/125; 257/666, 669; 361/813; 437/220

[56] References Cited

U.S. PATENT DOCUMENTS

| | | | |
|---|---|---|---|
| 2,156,262 | 5/1939 | Fink et al. | 29/DIG. 12 X |
| 4,704,187 | 11/1987 | Fujita | 29/827 X |
| 4,711,700 | 12/1987 | Cusack | 29/827 X |
| 4,820,658 | 4/1989 | Gilder, Jr. et al. | 29/827 X |
| 4,978,830 | 12/1990 | Millerick et al. | 219/121.67 |
| 5,270,570 | 12/1993 | Westerkamp | 257/666 |

FOREIGN PATENT DOCUMENTS

| | | | |
|---|---|---|---|
| 57-018342 | 1/1982 | Japan | 29/827 |
| 58-123747 | 7/1983 | Japan . | |
| 61-125161 | 6/1986 | Japan . | |
| 62-93095 | 4/1987 | Japan . | |
| 2-137687 | 5/1990 | Japan . | |
| 2-247089 | 10/1990 | Japan | 29/827 |
| 3-123063 | 5/1991 | Japan . | |
| 4-37493 | 2/1992 | Japan | 29/827 |
| 5-251605 | 9/1993 | Japan . | |

*Primary Examiner*—Peter Vo
*Attorney, Agent, or Firm*—Fay, Sharpe, Beall, Fagan, Minnich and McKee

[57] ABSTRACT

In a method for forming a lead frame (1) from a metallic plate, a metallic plate (11) is first etched to form outer leads (4) and outer portions (3b) of inner leads of the lead frame (1). Inner portions (3a) of the inner leads (3) are then laser-cut under the condition that a joint portion (7) is left so as to interconnect the inner leads (3) at their distal ends. Mechanical surface treatment and chemical surface treatment are then carried out to remove dross (10), spatters (9) and oxide films deposited during the laser cutting. Inner areas of the inner leads (3) connected to respective terminals of a semiconductor chip are then plated with gold to form plated terminal portions (3A). Subsequently, the region of the lead frame other than the outer leads (4) is coated with a protective film for solder plating and the outer leads (4) are plated with solder. The joint portion (7) left at the distal ends of the inner leads (3) is then cut off by laser cutting so that the inner leads (3) are separated from one another, thereby forming a final lead frame pattern. The protective film for solder plating is then removed, followed by washing and drying. The inner leads (3) are prevented from being curved due to thermal deformations with the laser cutting, resulting in highly accurate processing.

20 Claims, 25 Drawing Sheets

REGION PLATED WITH GOLD

PORTION PROCESSED IN STEP S220
PORTION PROCESSED IN STEP S210
PORTION PROCESSED IN STEP S270
PORTION PROCESSED IN STEP S220

FEED DIRECTION OF LEAD FRAME

PATH OF LASER BEAM DURING LASER CUTTING TO SEVER JOINT PORTION

LEAD FRAME PROCESSING METHOD

This is a continuation application of Ser. No. 08/256,476, filed Jul. 7, 1994 now abandoned.

TECHNICAL FIELD

The present invention relates to a method of processing lead frames on which semiconductor elements are mounted, and more particularly to a lead frame processing method suitable for processing lead frames of fine shapes and highly accurate dimensions which are employed to mount high-density and high-integration semiconductor elements, etc.

BACKGROUND ART

Lead frames are made of thin metallic plates in which patterns such as inner leads and outer leads are formed with predetermined gaps left between the leads. In such a lead frame, after mounting a semiconductor chip thereon, terminals of the semiconductor chip and the inner leads are electrically connected to each other.

Recently, there has been an ever stronger demand for a higher packing density and higher integration of semiconductor elements. Corresponding to the demand, lead frames for mounting semiconductor elements thereon have also been developed which are of fine shapes and highly accurate dimensions. In QFP type semiconductor devices, particularly, great weight has been given to increase the number of pins per lead frame. At the present, a lead frame having the number of leads in excess of 300 pins is manufactured. With an increase in the number of pins per lead frame, it has been required to develop a lead frame wherein inner leads adjacent to a semiconductor element are smaller in pitch and finer in shape. For example, while the inner lead pitch has been about 200 μm at minimum in the prior art, the pitch smaller than that level is required nowadays.

Such a lead frame having a number of pins and a small pitch has been primarily processed by etching and pressing in the past. By these processing methods, the lead frame can be manufactured relatively efficiently and easily.

JP, A, 2-247089 discloses a method of forming the portions where the pitch is not so small, such as outer leads and notches around a die pad, by the pressing or etching process, and then forming inner leads by laser cutting successively. In this method, only the inner leads having a small pitch is processed by laser cutting.

JP, A, 4-37493 discloses a method by which the portions which have been etched but not thoroughly the total thickness of a plate to be processed, i.e., the portions where the plate has not been pierced in the direction of plate thickness by etching, are subject to irradiation of a laser beam in a post-process so as to pierce the plate.

JP, A, 62-93095 discloses a method of changing (expanding or contracting) the section of a laser beam into an elongate elliptical shape by an optical system including a cylindrical lens. With this method, in the case of processing with fine dimensions, a long gap can be formed by a single irradiating step of the elongated laser beam (hereinafter referred to as elliptical laser beam).

Though not concerned with laser cutting, JP, A, 59-72754 discloses a method of leaving joint portions interconnecting inner leads at near their distal ends when a lead frame is fabricated by pressing, then removing residual strains generated during the pressing by heat treatment, and finally cutting the remained joint portions. The publication of this prior art describes that, by leaving a joint portion interconnecting inner leads at near their distal ends, release of processing strains generated during the pressing is suppressed to prevent deformations of the leads and lead positions are not shifted even with heat treatment or the like effected to remove the processing strains.

DISCLOSURE OF THE INVENTION

The etching or pressing process can only form gaps comparable in dimension to the thickness of metallic plates used, but cannot form satisfactorily gaps narrower and finer than that extent. As to the etching process, particularly, while it is conceivable to increase the etching factor by mixing an additive and the like in an etchant, this attempt has not yet succeeded in effectively improving the etching factor at the present. It is also conceivable to employ a thinner metallic plate as a base material to be processed, and form a lead frame using the thinner plate. However, there are limitations in reducing the plate thickness since the strength would be insufficient if the base material is too thin.

Because of employing a laser beam which can be condensed into a very small beam diameter, the prior arts disclosed in JP, A, 2-247089 and JP, A, 4-37493 are suitable for fine processing and can form fine inner leads having a small pitch. Also, these two prior arts can manufacture efficiently lead frames in combination of the etching or pressing process, which is relatively highly efficient, with the laser cutting.

In the above two prior arts, however, no considerations are paid to thermal deformations incidental to the laser cutting. When the pitch interval is narrow as encountered in processing lead frames for use with high-density and high-integration semiconductor elements, the manufacture is greatly affected by thermal deformations incidental to the laser cutting. Particularly, when inner leads are successively formed by the laser cutting like JP, A, 2-247089 under the condition that the portions other than the inner leads, i.e., the portions which are not so fine, including outer leads and notches around a die pad, the laser cutting is carried out with distal ends of the inner leads being free, causing a problem that the inner leads are curved by thermal deformations and hence the processing shape and dimensional accuracy required for the inner leads cannot be realized.

During the laser cutting, most of the molten metal produced irradiation of a laser beam is fallen down, but a part of the molten metal remains in place and agglomerates to grow into several uneven aggregates under differences in surface tension due to slight temperature differences. The aggregates are solidified there to form metal particles called dross. The dross are apt to deposit on the side of a lead frame opposite to the side irradiated by the laser beam (i.e., the back side), and it is very difficult to remove the dross deposited. Further, the molten metal may scatter to deposit as spatters on the surface of the lead frame, or an oxide film may be formed thereon. Accordingly, the dimensional accuracy and cleanness severely required for lead frames cannot be maintained, and hence product quality is degraded considerably. In addition, the dross and spatters tend to become primary causes of performance defects such as short-circuits between leads of the lead frame.

In lead frames, inner end portions of inner leads are often subject to plating of metal having a good conductivity for the purpose of improving the joining strength between respective terminals of a semiconductor chip and the inner leads. However, if the dross deposits on those portions as explained above, a plating layer is concentrated to thicken locally on convex portions where the dross is deposited, while the thickness required for the plating layer cannot be satisfactorily obtained in other portions. These portions are likely to become primary causes of performance defects such as short-circuits, and also lead to the worsening of adhesion when joined to other parts, resulting in remarkable deterioration of product quality.

With the prior art disclosed in JP, A, 62-93095, the laser cutting can be performed at a speed much higher than the case of using a circular laser beam, by setting the lengthwise direction of section of the elliptical laser beam to be coincident with the direction in which the cutting is advanced, and repeating the cutting step such that successive irradiation areas of the laser beam are overlapped with each other to some extent. Also, since the laser beam is elongate in shape, the cut face is relatively trim with less projections or recesses even if the laser beams are overlapped with each other to a small extent. In this prior art, however, the dross and spatters are similarly apt to deposit on lead frames, and great difficulties are encountered in removing them. This prior art also causes an oxide film to be formed on the surface of a metallic plate. In the case of employing the elliptical laser beam, particularly, the region processed by one irradiating step is wide, which increases the amount of the dross and spatters deposited.

In view of the problems as described above, an object of the present invention is to provide a laser cutting method which can process lead frames each having a number of pins and a small pitch, while solving the foregoing problems incidental to laser cutting.

To achieve the above object, according to the present invention, there is provided a lead frame processing method with which a metallic plate is subject to laser cutting to form at least inner portions of inner leads, thereby forming, from the metallic plate, a lead frame comprising a number of inner leads and a number of outer leads positioned outwardly of the inner leads in continuous relation, wherein the method comprises a first step of forming the inner portions of the inner leads by the laser cutting under the condition that a joint portion is left so as to interconnect the inner leads at their distal ends, a second step of forming outer portions of the inner leads and the outer leads in the same step, and a third step of cutting off the joint portion to complete the inner leads.

With the present invention arranged as above, the inner portions of the inner leads are formed in the first step with their distal ends not separated from one another to become free ends. Looking at one inner lead, therefore, the conditions under which thermal strains remain are the same in both cut faces of the inner lead, whereby the occurrence of thermal deformations incidental to the laser cutting is suppressed. Accordingly, the inner leads are prevented from being curved or so in the plate plane, enabling the inner leads to be processed with high accuracy. After completion of the second step of forming the outer portions of the inner leads, the outer leads, etc. in the same step, the joint portion is cut off in the third step so that the inner leads are separated from one another.

In the above lead frame processing method, preferably, the cutting-off of the joint portion in the third step is performed after the second step and after other post-processing necessary to form the lead frame.

Therefore, when the outer portions of the inner leads and the outer leads are formed and the other processing necessary to form the lead frame are performed, the inner leads are mutually fixed and restricted by the joint portion and hence the rigidity is maintained. On these occasions, accordingly, the inner leads are prevented from being disordered in their array, making it possible to facilitate handling of the lead frame and to maintain the dimensional accuracy thereof.

Preferably, the above method further comprises, before the third step of cutting off the joint portion, a fourth step of removing foreign matters such as dross generated with the laser cutting in the first step.

In the above, preferably, the fourth step includes a step of applying mechanical surface treatment to surfaces of the lead frame, or applying chemical surface treatment to surfaces of the lead frame.

Therefore, under the condition that the inner leads are mutually fixed and restricted by the joint portion and hence the rigidity is maintained, foreign matters such as dross are removed and the plate surfaces are made clean. In this step, accordingly, the inner leads are also prevented from being disordered in their array, making it possible to facilitate handling of the lead frame and to maintain the dimensional accuracy thereof. The step of removing foreign matters such as dross preferably includes a step of applying mechanical or chemical surface treatment by which foreign matters such as dross, spatters and oxide films generated with the laser cutting can be removed.

Preferably, the above lead frame processing method further comprises, before the third step of cutting off the joint portion, a fifth step of forming plated terminal portions, which are made of metal having a good conductivity and are used for connection to a semiconductor chip, at the distal ends of the inner leads.

Therefore, the plated terminal portions made of metal having a good conductivity are formed under the condition that the inner leads are mutually fixed and restricted by the joint portion and hence the rigidity is maintained. On this occasion, accordingly, the inner leads are also prevented from being disordered in their array, making it possible to facilitate handling of the lead frame and to maintain the dimensional accuracy thereof. Additionally, the provision of the plated terminal portions improves the joining strength between respective terminals of a semiconductor chip and the inner leads.

In the above case, the present method preferably further comprises a sixth step of removing foreign matters such as dross generated with the laser cutting in the first step, and the formation of the plated terminal portions made of metal having a good conductivity in the fifth step is carried out after the sixth step.

Therefore, the plated terminal portions are formed on the surfaces of the inner leads in clean condition from which foreign matters such as dross, spatters and oxide films have been removed. Accordingly, the satisfactory plated terminal portions having good adhesion can be obtained.

Preferably, the present method further comprises, after the fifth step, a seventh step of coating a protective film over at least the plated terminal portions, the protective film being removed after the third step of cutting off the joint portion.

By so coating the protective film over at least the plated terminal portions, the surfaces of the plated terminal portions are protected. Then, by cutting off the joint portion under that condition, the dirt and so on generated at the time of cutting off the joint portion are deposited on the protective film. By removing the protective film thereafter, the dirt and so on which have been deposited on the protective film can be all removed together. Particularly, when the joint portion is cut off by laser cutting as described later, molten metal scatters in the form of spatters, but these spatters are also deposited on the protective film and are then removed together upon removal of the protective film.

Preferably, the above lead frame processing method further comprises, before the third step of cutting off the joint portion, an eighth step of plating the outer leads with solder.

Therefore, solder is plated under the condition that the inner leads are mutually fixed and restricted by the joint portion and hence the rigidity is maintained. On this occasion, accordingly, the inner leads are also prevented from being disordered in their array, making it possible to facilitate handling of the lead frame and to maintain the dimensional accuracy thereof. Such solder plating can increase the joining strength between the outer leads and a circuit pattern when a semiconductor device is mounted to the surface of a printed board.

In the above case, preferably, the eighth step is carried out after coating a protective film for solder plating in the region where the solder plating is not applied, the protective film for solder plating being removed after the third step of cutting off the joint portion.

Therefore, the dirt and so on generated at the time of cutting off the joint portion are deposited on the protective film for solder plating. Thereafter, by removing the protective film for solder plating, the dirt and so on which have been deposited on the protective film can be all removed together.

In the above lead frame processing method, preferably, the third step is a step of cutting off the joint portion by laser cutting.

This enables the joint portion to be cut off easily with high accuracy. In this case, while thermal processing is employed, the spread of heat induced by the irradiation of a laser beam is limited to a small region near the distal end of each inner lead and, therefore, the inner leads are not curved or so due to thermal deformations unlike the above-described case of forming the gaps to divide the inner leads individually.

Preferably, the second step is an etching process or a punching process by a press.

These etching process and punching process by a press are more efficient than the laser cutting and, because of being non-thermal processing, cause neither thermal strains nor thermal deformations. Therefore, by combining the second step in which the outer portions of the inner leads and the outer leads which are not so small in pitch are formed by etching or punching by a press with the first step in which the inner portions of the inner leads comprising a number of pins and having a small pitch are laser-cut, the portion to be laser-cut can be limited to a necessary and minimum extent, and hence the highly accurate lead frame can be processed with high efficiency.

Preferably, the second step is carried out before or after the first step.

Thus, the second step of forming the outer portions of the inner leads and the outer leads may be carried out before or after the first step of laser-cutting the inner portions of the inner leads. In any case, similar results are obtained.

Preferably, the above lead frame processing method further comprises, before the first step, a ninth step of processing the inner portions of the inner leads through only a part of the plate thickness by an etching process, and the partly processed inner portions of the inner leads are pierced through the remaining plate thickness by the laser cutting in the first step.

With such an arrangement, by processing the inner portions of the inner leads through only a part of the plate thickness by an etching process in the ninth step, recesses are formed in the etched portions. Then, the plate is pierced at the recesses through the remaining plate thickness by the laser cutting in the first step. At this time, since the laser beam can be irradiated by utilizing the recess as a guide mark, the laser cutting can be performed with easy positioning between the laser beam and the cut position. Also, since the thickness of the metallic plate at locations to be laser-cut becomes thinner, the amount of dross generated with the laser cutting is reduced and the dross is deposited in the recesses. Accordingly, the dross is prevented from projecting from the surfaces of the lead frame and a reduction in accuracy of the plate thickness can be avoided.

In the above lead frame processing method, preferably, the laser cutting in the first step is carried out by employing a pulse-like laser beam being elongate in cross-section and having an energy density selected to such an extent that the metallic plate cannot be pierced therethrough in the direction of plate thickness by one pulse, by setting the lengthwise direction in the cross-sectional shape of the laser beam to be coincident with the direction in which the laser cutting is advanced, and by irradiating the laser beams while shifting the laser beams successively in the direction in which the laser cutting is advanced such that the area irradiated by the laser beam of every one pulse is overlapped with each other through a predetermined length.

In this arrangement, a pulse-like laser beam being elongate in cross-section and having an energy density selected to such an extent that the metallic plate cannot be pierced therethrough in the direction of plate thickness by one pulse is employed. Then, the laser cutting is performed by setting the lengthwise direction in the cross-sectional shape of the laser beam to be coincident with the direction in which the laser cutting is advanced, while shifting the irradiation position of the laser beam successively such that the area irradiated by the laser beam of every one pulse is overlapped with each other through a predetermined length. Specifically, a groove-like processed portion which is not pierced through the metallic plate in the direction of plate thickness is formed by the irradiation of one-pulse laser beam, and the subsequent laser beam is irradiated to the groove-like processed portion while shifting the irradiation position successively in the direction in which the laser cutting is advanced such that the area irradiated by every laser beam is overlapped with each other through a predetermined length. Such a combination of the successive irradiations enables a cut opening to be formed to pierce the metallic plate in the direction of plate thickness. By repeating the above process, the thoroughly cut openings are joined together to extend in the direction in which the laser cutting is advanced and, as a result, a predetermined gap is defined.

For example, in the case where the metallic plate is processed a half or more of the plate thickness by the irradiation of one-pulse laser beam, by progressing the laser cutting such that the area irradiated by one the laser beam is overlapped with ½ or more of the next irradiation area in the lengthwise direction of the laser beam. By so repeating the irradiation, even with each laser beam having a uniform energy distribution, a cut portion in the step-like form extending in the direction of plate thickness is successively defined. Thus, a groove is formed upstream and a thoroughly cut opening is formed downstream in the direction in which the laser cutting is advanced.

Most of the molten metal generated with the irradiation of the laser beam is fallen down at the time the metallic plate is pierced, but some part of the molten metal remains on the metallic plate to deposit on a bottom surface of the groove and on the underside of walls of the thoroughly cut opening. Here, the upstream groove in the direction in which the laser cutting is advanced represents a portion where the metallic plate is not pierced in the direction of thickness thereof to remain partly and heat is more easily released than the walls of the downstream thoroughly cut opening. Accordingly, there occurs a difference in cooling speed between the groove and the thoroughly cut opening such that the temperature of the groove becomes lower. Because the surface tension of molten metal is greater at lower temperatures than at higher temperatures, the molten metal deposited on the underside of walls of the thoroughly cut opening is attracted toward the groove at lower temperatures due to the difference in surface tension. As a result, the dross is always deposited on the bottom surface of the upstream groove in the direction in which the laser cutting is advanced. Then, when the metal in the groove is molten and cut to fall down upon the next irradiation of the laser beam, the dross deposited on the bottom surface of the groove is also molten and fallen down together therewith. The molten metal still remaining at this time behaves in the same manner as described above and, thereafter, the above process is repeated.

With the above arrangement, therefore, the molten metal generated with the irradiation of the laser beam neither agglomerates into several uneven aggregates nor grows into large masses. Even though remains, the dross is only deposited on the bottom surface of the upstream groove in the direction in which the laser cutting is advanced. Thus, the inner portions of the inner leads are not affected by the deposited dross after the laser cutting, whereby dimensional accuracy and cleanness can be improved.

In the above case, by progressing the laser cutting from the outer side to the inner side of the lead frame, the groove is formed at the inner distal end of the lead frame, i.e., in an outer peripheral area of the joint portion, and the dross is collected to deposit on the bottom surface of the groove. The dross deposited in the groove is finally all removed together upon the joint portion being cut off.

BRIEF DESCRIPTION OF THE DRAWINGS

FIG. 3 is a view for explaining step S110 to step S112 in FIG. 2 in which.

FIG. 8 is a graph showing a temperature change recorded during thermal processing such as laser cutting, and corresponding behaviors of a thermal-expansion deformation, an elastic strain and a plastic strain of the metallic plate in which.

FIG. 9 is a view for explaining, from the aspect of principles, the process in which a number of gaps are formed by irradiating a laser beam to cut the metallic plate successively from the plate end in which.

FIG. 18 is a view showing another example of a semiconductor device employing the lead frame of FIG. 1.

FIG. 24 is a sectional view showing the process of processing inner portions of inner leads in a fifth embodiment of the present invention in which.

FIG. 25 is a view for explaining laser cutting in a sixth embodiment of the present invention in which.

FIG. 26 is a view of a laser cutting apparatus used for the laser cutting in FIG. 25 in which.

FIG. 27 is a view for explaining behavior of molten metal (dross) during the laser cutting in FIG. 25 in which.

BEST MODE FOR CARRYING OUT THE INVENTION

Embodiments of a lead frame processing method of the present invention will be hereinafter described with reference to the drawings.

FIRST EMBODIMENT

To begin with, a first embodiment of the present invention will be described with reference to FIGS. 1 to 19.

Figure 1:
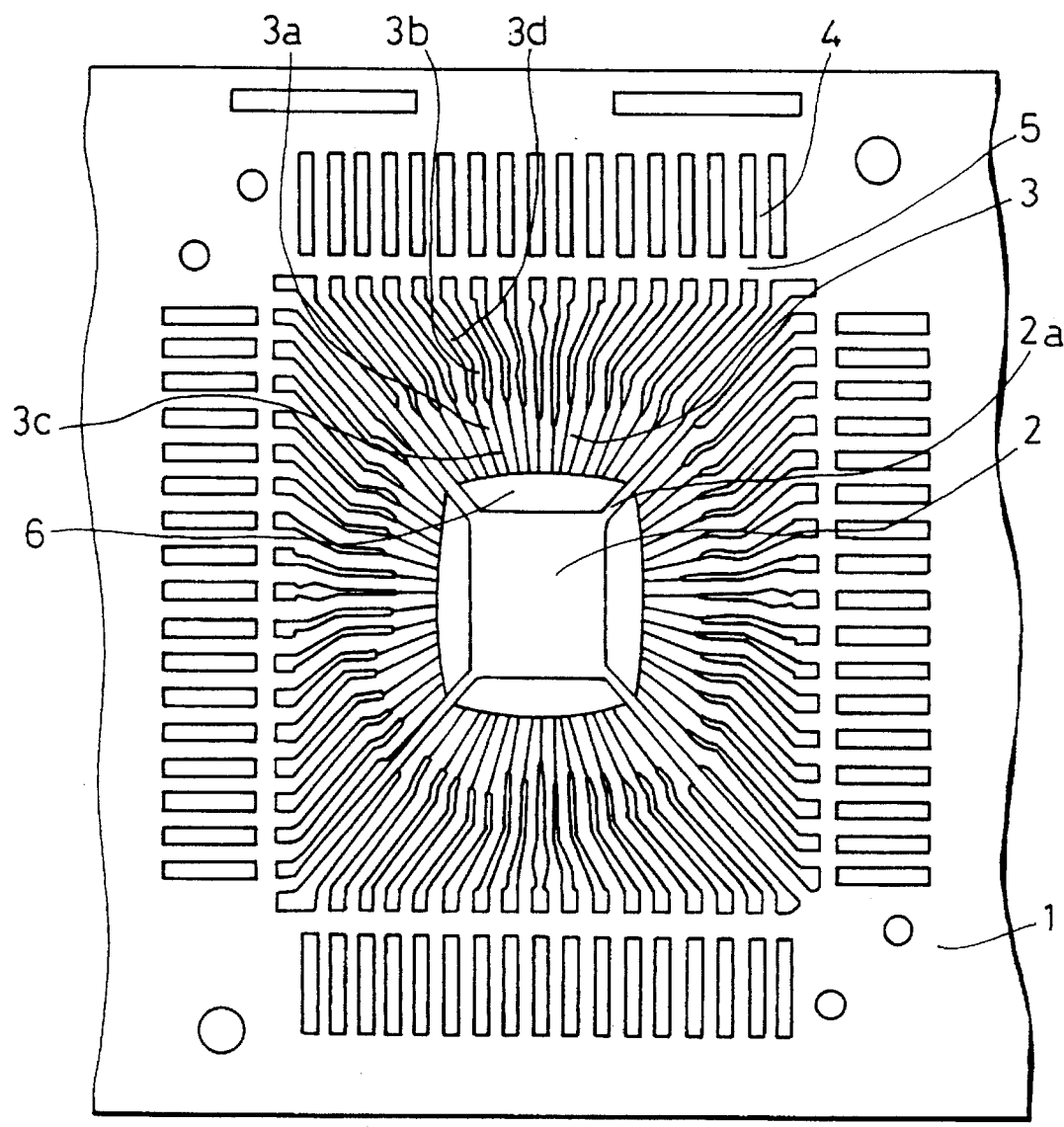
FIG. 1 is a view of a lead frame processed according to a first embodiment of the present invention.

A description will be first made of the configuration of a lead frame processed by this embodiment. In FIG. 1, a lead frame 1 is a QFP (Quad Flat Package) type lead frame comprising a metallic plate which has a predetermined thickness and is made of, e.g., steel, copper alloy, 42 Alloy or Kovar. At a central portion of the lead frame 1, there is disposed a die pad 2 mounting a semiconductor element thereon. A number of inner leads 3 and outer leads 4 in continuous relation to the inner leads 3 are disposed to surround the die pad 2, pairs of the inner leads 3 and the outer leads 4 adjacent to each other being interconnected and supported by dam bars 5. Notches 6 are defined around the die pad 2 except for arms 2a. With the presence of the notches 6, the inner leads 3 are disconnected from the die pad 2 and every adjacent twos of the inner leads 3 are separated from each other. The dam bars 5 serve to dam a resin flow when molding a semiconductor element and also to reinforce the inner leads 3 and the outer leads 4, and are removed after the molding.

The inner leads 3 are extended in the form converging toward the die pad 2 as a whole, and their distal ends each have a width enough to effect electrical connection, such as wire bonding, after mounting a semiconductor element on the die pad 2. Accordingly, a gap $3c$ between every adjacent twos of inner portions $3a$ of the inner leads 3 is much narrower than a gap $3d$ between every adjacent twos of outer portions $3b$ of the inner leads 3, and hence makes up a very fine structure.

A description will now be made of manufacture steps of the lead frame with reference to FIGS. 2 to 16.

Figure 2:
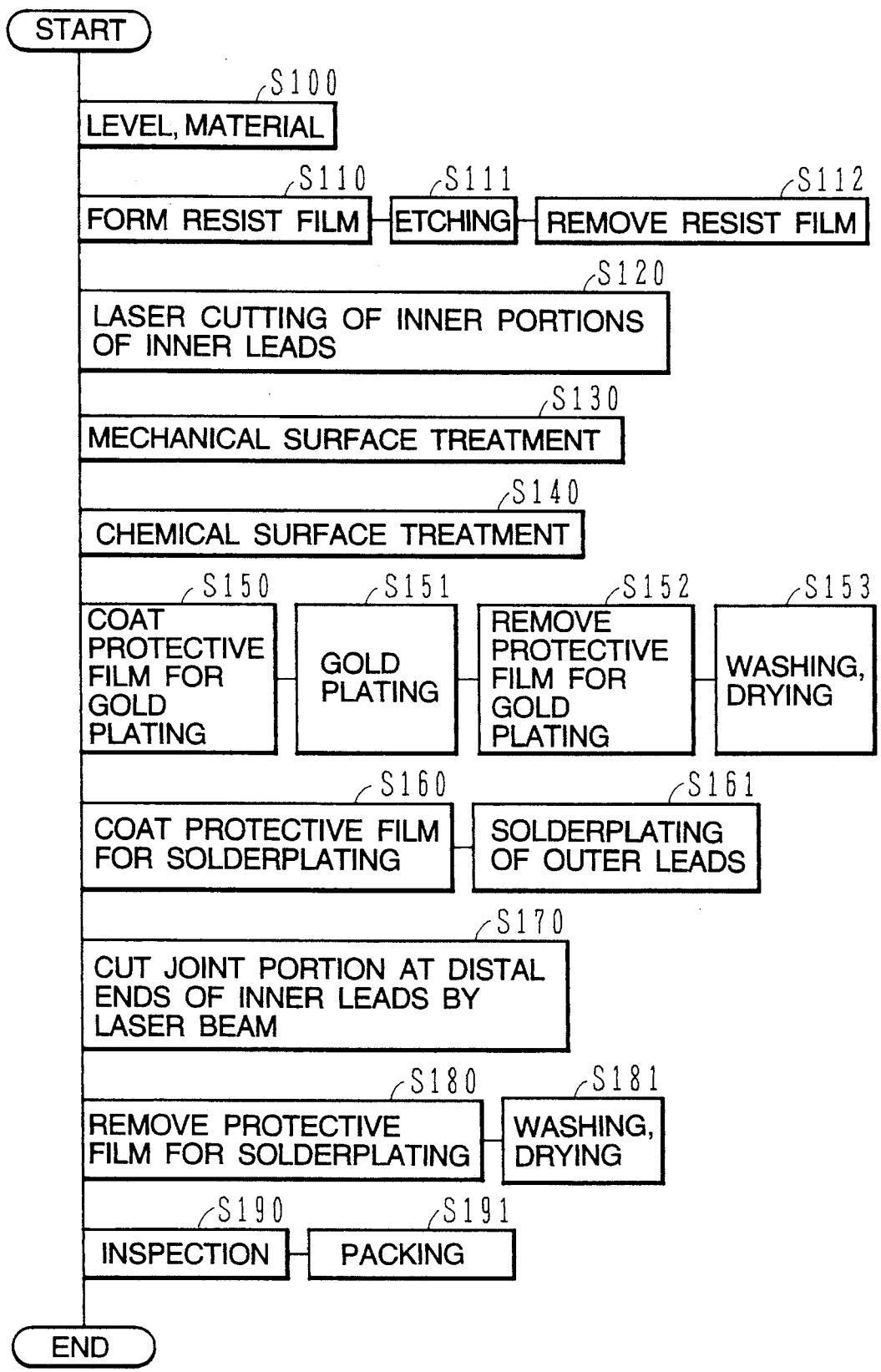
FIG. 2 is a chart showing manufacture steps of the lead frame shown in FIG. 1.

First, in step S100 in FIG. 2, the above-mentioned material, i.e., the metallic plate, is leveled by being fed through a leveler to correct curves of the material and to obtain a flat plate having a predetermined thickness $t_0$ (see FIG. 3).

Figure 3A:
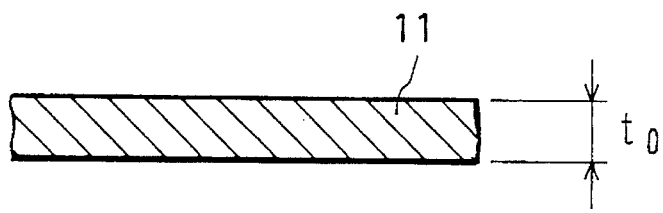
FIG. 3A shows a section of a metallic plate to be processed.
Figure 3B:
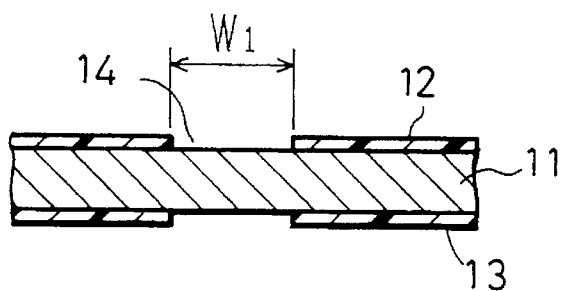
FIG. 3B shows the condition that resist films in a predetermined pattern are formed on the plate.

Then, an etching process is carried out as follows. In step S110 in FIG. 2, resist films 12, 13 in a predetermined pattern, shown in FIG. 3B, are formed on both sides of a metallic plate 11 having the predetermined thickness $t_0$ as shown in FIG. 3A. This step is performed by coating a photosensitive resist agent for photoetching on both sides of the metallic plate 11, drying it, and then optically transferring a predetermined pattern of the lead frame to the photosensitive resist agent so that the predetermined pattern is printed as an etching pattern on both sides of the metallic plate 1. It is assumed that, at this time, an opening 24 being $W_1$ wide is formed in each of the resist films 12, 13.

Figure 3C:
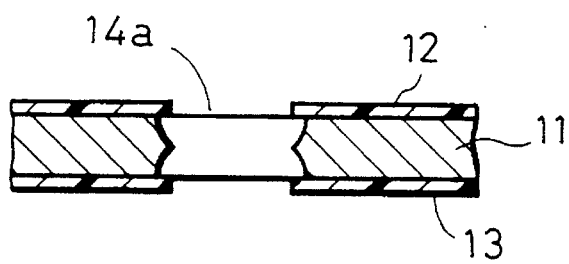
FIG. 3C shows the condition that a through-hole is formed in the plate by etching.
Figure 3D:
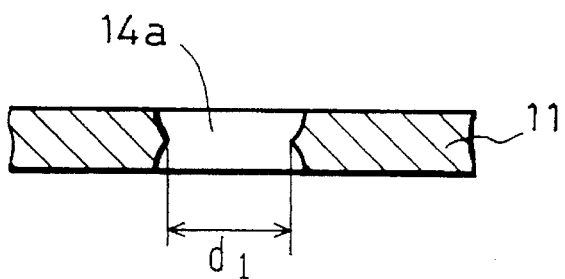
FIG. 3D shows the condition that the resist films are removed.

After that, in step S111 in FIG. 2, the metallic plate 11 is etched from both sides at the openings 14 of the resist films 12, 13 shown in FIG. 3B so as to penetrate the plate and form a through-hole $14a$ with the opening width $d_1$, as shown in FIG. 3C. The predetermined pattern is thus formed. Finally, in step S112 in FIG. 2, the resist films 12, 13 coated on both sides of the metallic plate 11 is removed as shown in FIG. 3D.

Figure 4:
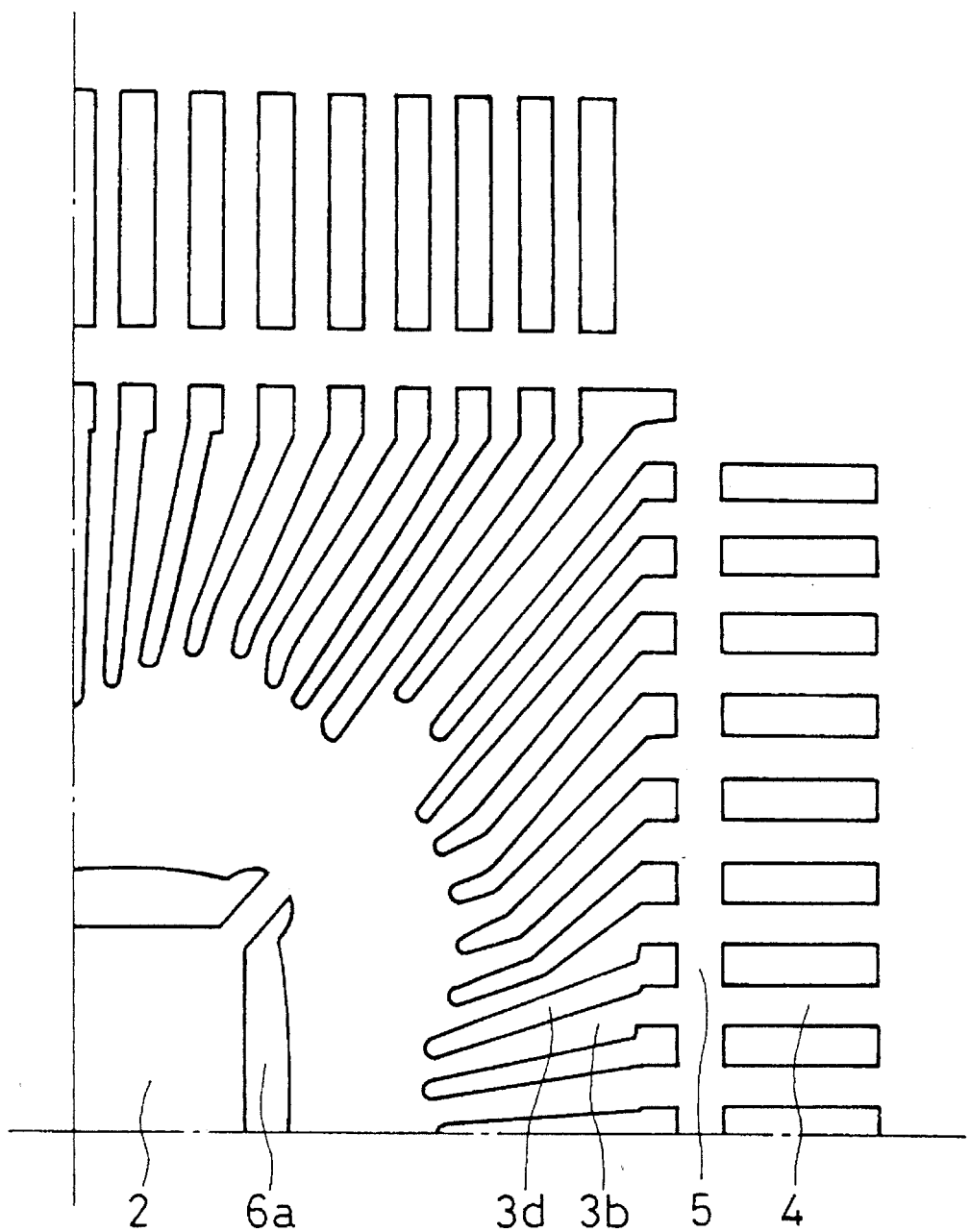
FIG. 4 is a view of a ¼ portion of the lead frame processed in step S110 to step S112 in FIG. 2.

In above step S110, the outer leads 4, the outer portions $3b$ of the inner leads 3 which are not so fine, and notches $6a$ are defined by a single etching process as shown in FIG. 4. The notches $6a$ are respective parts of the notches 6 shown in FIG. 1, and finally become the notches 6 in later-described step S170 in FIG. 2. Note that, in consideration of symmetry, FIG. 4 shows only a ¼ portion of the lead frame (this applies equally to FIGS. 7, 11, 14, 15, 16, 18B and 21 below). As the photosensitive resist agent and the etchant are used conventionally known ones. Instead of the above etching, the metallic plate may be punched by a press. Substantially the same processing can be obtained by the pressing as well.

Then, in step S120 in FIG. 2, the metallic plate processed as above is subject to laser cutting.

Figure 5:
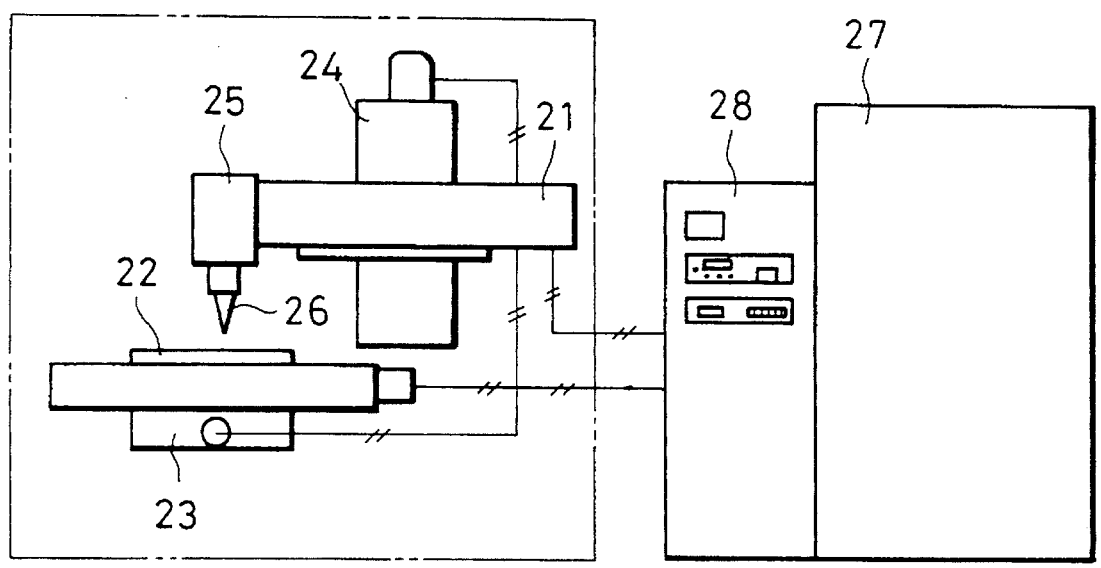
FIG. 5 is a view showing the construction of a laser cutting apparatus for use in step 120 in FIG. 2.

A laser cutting apparatus for use in this step will now be described. As shown in FIG. 5, the apparatus comprises a laser oscillator 21 for emitting a laser beam, an XY-table 23 which is movable in a horizontal plane (i.e., in the X-axis and Y-axis directions) with a metallic plate 22 as a workpiece mounted thereon, a Z-table 24 for moving the laser oscillator 21 in the vertical direction (i.e., in the Z-axis direction), a working head 25 attached to the laser oscillator 21, a nozzle 26 attached to a bottom surface of the working head 25 so as to face the metallic plate 22, a power supply 27 for supplying electric power for laser oscillation in the laser oscillator 21, and a controller 28 for automatically or manually controlling the operation of movement of the XY-table 23 in the horizontal plane (i.e., in the X-axis and Y-axis directions), the operation of vertical movement of the Z-table 24, and the oscillating operation of the laser oscillator 21.

Figure 6:
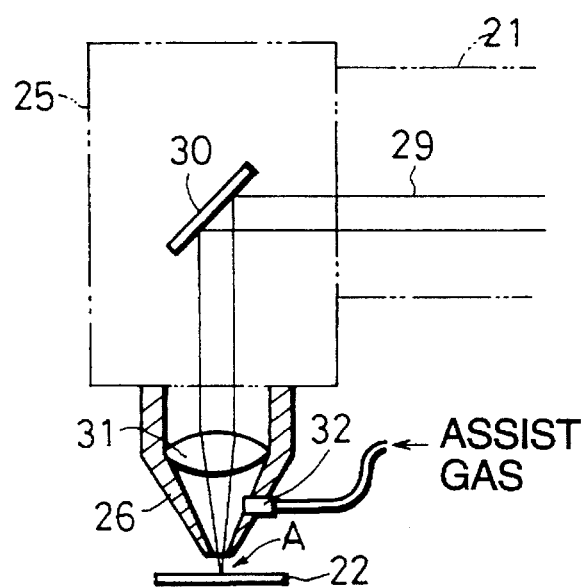
FIG. 6 is a view for explaining the situation where a laser beam is irradiated to a metallic plate by the laser cutting apparatus shown in FIG. 5.

FIG. 6 is a view for explaining the situation where a laser beam is irradiated to the metallic plate by the laser cutting apparatus shown in FIG. 5. In FIG. 6, a laser beam 29 is emitted from the laser oscillator 21 to the working head 25. An optical system within the working head 25 includes a bending mirror 30 which reflects the laser beam 29 and guides it toward the metallic plate 22. A condensing lens 31 is disposed within the nozzle 26 positioned to face the metallic plate 22. The laser beam 29 is condensed sufficiently to provide an energy density required to enable laser cutting in the surface of the metallic plate 22. The condensed laser beam 29 is emitted to the exterior from a distal end of the nozzle 26 and is irradiated to the metallic plate 22 at a cutting position A. Further, the nozzle 26 is provided with an assist gas supply port 32 so that an assist gas is ejected from the distal end of the nozzle 26 to the cutting position A coaxially with the laser beam 29.

In the above arrangement, the metallic plate 22 is cut by the laser beam 29 as follows. The Z-table 24 is operated to adjust the vertical positional relationship between the components for position setting so that the laser beam 29 condensed by the condensing lens 31 is focused to the position A on the cut surface of the metallic plate 22. After that, under control of the controller 28, the assist gas is supplied and the laser oscillator 21 is oscillated for irradiating the laser beam 29 to the metallic plate 22. The laser beam 29 is condensed to provide thermal energy enough to melt a surface portion of the metallic plate 22 where the laser beam is irradiated. The molten metal serves as a heat source to progress the melting gradually from the plate surface in the direction of depth so that the metallic plate 22 is eventually pierced to form a through-hole therein. Then, the XY-table 23 is moved following a required path under control of the controller 28 to move the laser beam 29 along the portion to be cut, thereby processing the metallic plate 22. Note that, in the description, the laser beam 29 emitted from the laser oscillator 21 has a substantially circular shape in cross-section.

Figure 7:
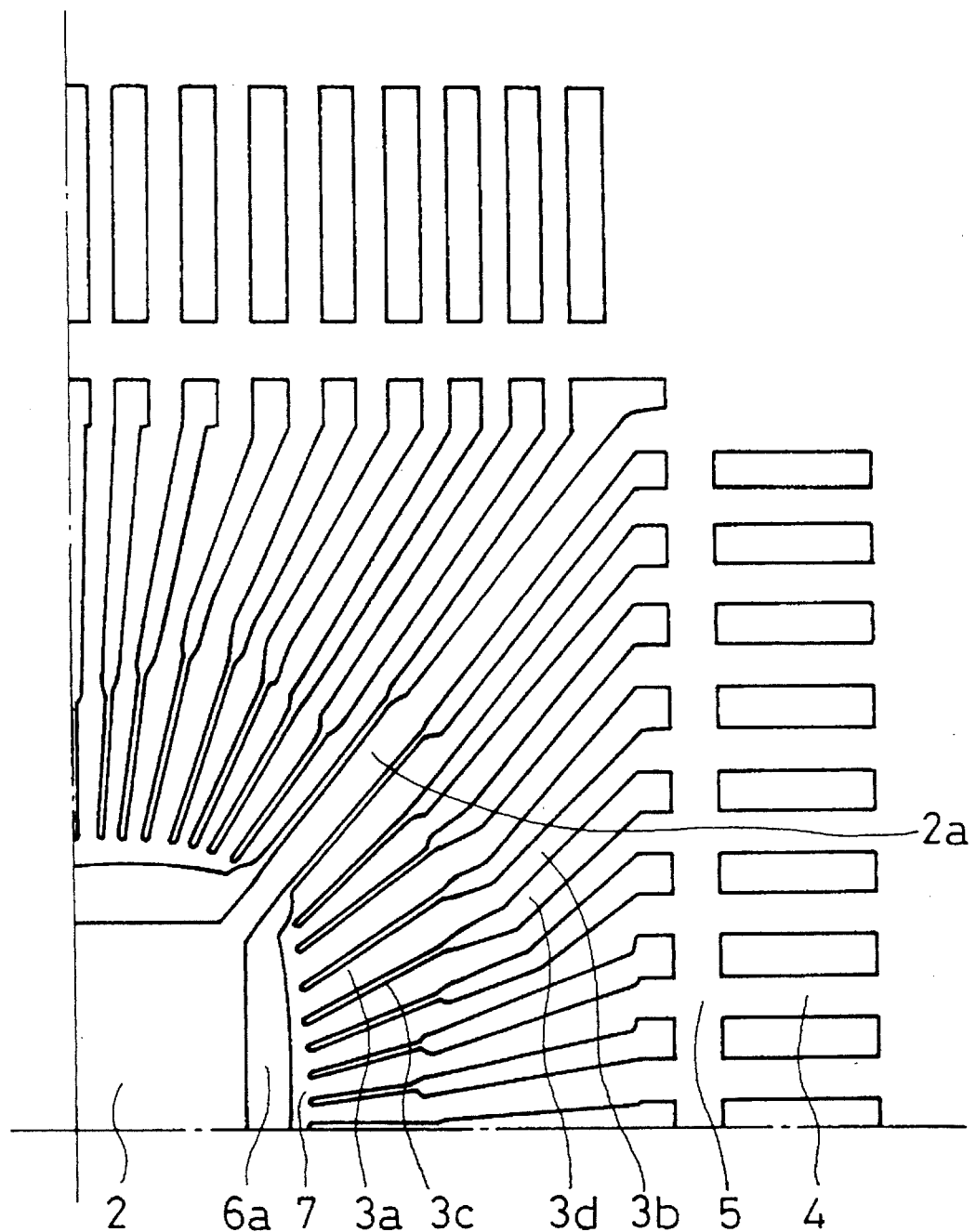
FIG. 7 is a view of a ¼ portion of the lead frame processed in step S120 in FIG. 2.

Thus, the narrow gaps 3c between the inner leads 3 are laser-cut and the inner portions 3a of the inner leads are formed as shown in FIG. 7. At this time, the inner portions 3a of the inner leads are laser-cut while leaving a joint portion 7 in such a condition as to interconnect respective distal ends of the inner portions 3a. On the other hand, the outer portions 3b of the inner leads are interconnected by the dam bars 5. Since the laser cutting is under the condition that the inner leads 3a of the inner leads are not separated from one another, the occurrence of thermal deformations due to the laser cutting is suppressed to prevent the inner portions 3a from being curved or distorted in the plate plane. However, the gaps 3c separating the arms 2a from the adjacent leads are extended to reach the notches 6a so that the die pad 2 is supported by the arms 2a extending from the four apexes of the die pad.

Further, non-thermal processing such as etching or punching by a press is more efficient than the laser cutting. Therefore, by combining both the processing methods, i.e., the non-thermal processing and the laser cutting, with each other depending on the portion to be processed, the portion to be laser-cut can be limited to a necessary and minimum extent, and hence the lead frame can be processed with good accuracy and high efficiency.

It is desired that, after the laser cutting, the metallic plate is cooled by spraying a cooling medium such as gas or liquid to the plate, or contacting a cooling block with the same.

If the laser cutting is performed under the condition that the inner portions 3a of the individual inner leads are separated at their distal ends from one another without leaving the joint portion 7 unlike this embodiment, the inner portions 3a of the inner leads would be curved or so in the plate plane due to thermal deformations. The principle of such a process will be described with reference to FIGS. 8 and 9.

Figure 8A:
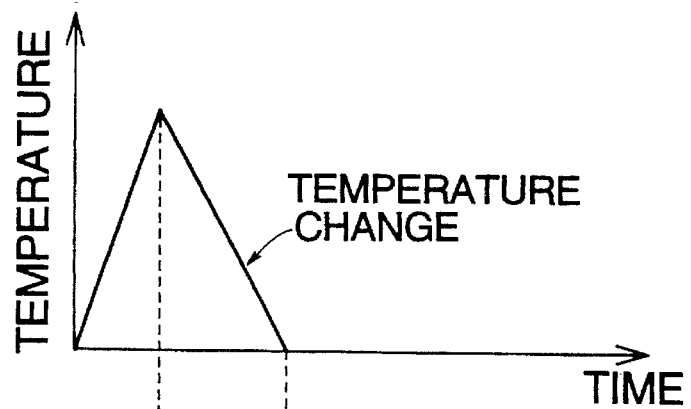
FIG. 8A shows the temperature change.
Figure 8B:
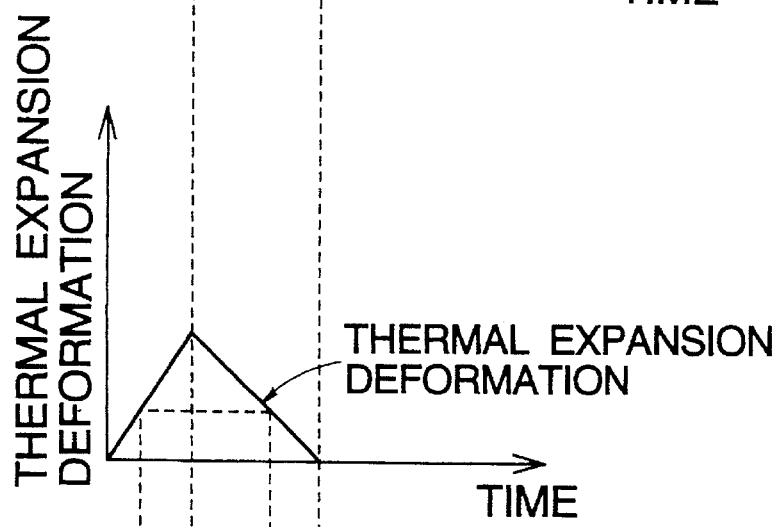
FIG. 8B shows the thermal-expansion deformation of the metallic plate when subject to the temperature change in FIG. 8A.
Figure 8C:
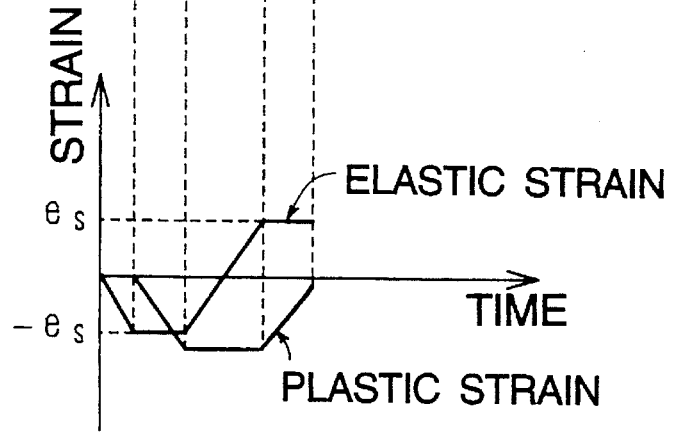
FIG. 8C shows behaviors of the elastic strain and the plastic strain of the metallic plate caused when the metallic plate is held in a restricted condition.

FIGS. 8A to 8C are graphs showing a temperature change recorded when thermal processing such as laser cutting is effected on a metallic plate, and corresponding behaviors of a thermal-expansion deformation, an elastic strain and a plastic strain of the metallic plate. When thermal processing is applied to a metallic plate so that the whole metallic plate is evenly subject to the temperature change as shown in FIG. 8A, the thermal-expansion deformation as shown in FIG. 8B is caused corresponding to such a temperature change. In other words, when the metallic plate is in a free or non-restricted state, there occurs the thermal-expansion deformation as shown in FIG. 8B. On the contrary, when the metallic plate is restricted in the plate plane, an elastic strain is generated and increased in the direction of compression, as shown in FIG. 8C, so as to prevent the occurrence of the thermal-expansion deformation. Note that, in FIG. 8C, a positive direction represents the direction of tension and a negative direction represents the direction of compression. Subsequently, when the elastic strain reaches a limit $-e_s$ of elasticity, a plastic strain in the direction of compression is now generated and increased since then, whereas the elastic strain in the direction of compression is not increased but remains constant during an increase in the plastic strain in the direction of compression.

When the temperature is lowered as shown in FIG. 8A, the thermal-expansion deformation is also reduced as shown in FIG. 8B under the condition that the metallic plate is not restricted. On the other hand, under the condition that the metallic plate is restricted in the plate plane, the elastic strain in the direction of compression is first reduced and, after crossing 0, the elastic strain in the direction of tension is generated and increased, as shown in FIG. 8C, so as to prevent the occurrence of the thermal-expansion deformation. While the elastic stain is increasing, the plastic strain in the direction of compression is not changed but remains constant. When the elastic strain in the direction of tension reaches a limit $e_s$ of elasticity, the plastic strain in the direction of compression is now reduced, whereas the elastic strain in the direction of tension is not increased but remains constant. It is thus known that, after the thermal processing is performed under the condition that the metallic plate is restricted, the elastic strain in the direction of tension and the plastic strain in the direction of compression are generally left in the plate as shown in FIG. 8C.

In the case where a limited portion of a thin metallic plate is subject to a temperature change for quick heating and quick cooling as with the laser cutting in this embodiment, there also occur the phenomena explained relating to FIGS. 8A to 8C even if the metallic plate is not restricted in the plate plane by applying external forces to the plate, because the portion of the metallic plate under the laser cutting is essentially restricted by the surrounding portion not heated.

Figure 9A:
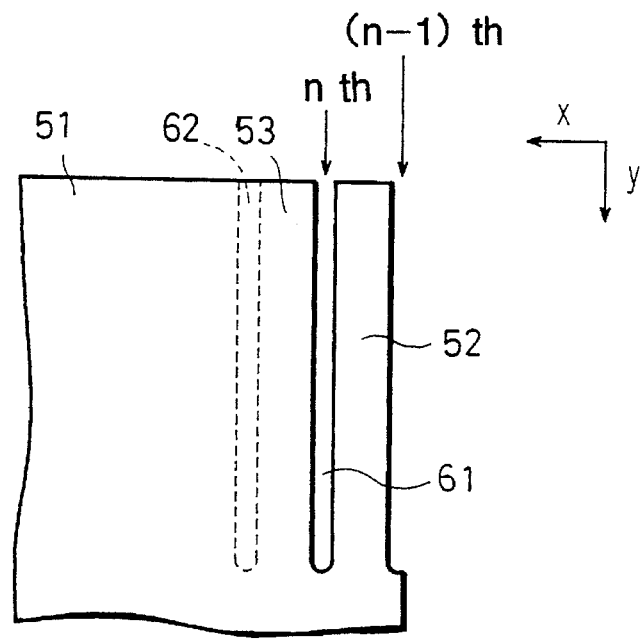
FIG. 9A shows the condition that an n-th cutout has been formed.
Figure 9B:
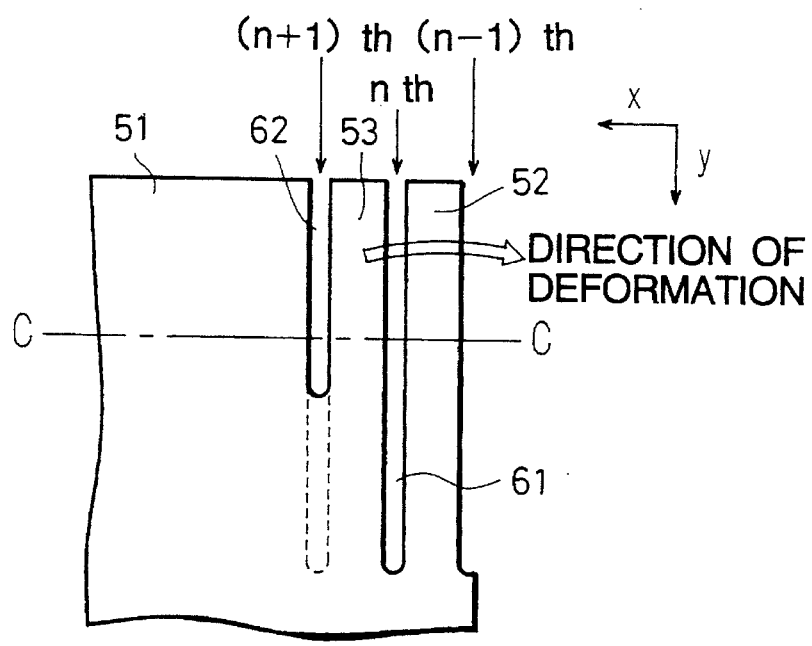
FIG. 9B shows the condition that an (n+1)-th cutout is being formed.
Figure 9C:
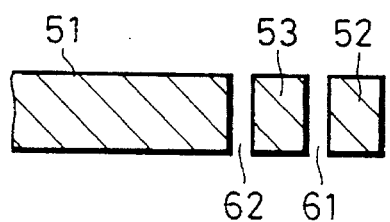
FIG. 9C is a sectional view taken along line C—C in FIG. 9B.

Taking the above into account, a description will now be made, from the aspect of principles, of the process in which a number of gaps are formed by irradiating a laser beam to cut the metallic plate successively from the plate end as shown in FIGS. 9A to 9C. Note that, in FIGS. 9A and 9B, x- and y-axes are defined as shown in a plane including the metallic plate 51. Also, it is here assumed that after an n-th cutout 61 has been formed by the n-th laser cutting from an outer end of a metallic plate 51 in the y-axis direction as shown in FIG. 9A, an (n+1)-th cutout 62 is formed by the (n+1)-th laser cutting as shown in FIG. 9B, whereby slender segments 52, 53 are formed. A thermal strain and a thermal deformation generated by the laser cutting will be described below in connection with the segment 53 formed as a result of the n-th laser cutting and the (n+1)-th laser cutting.

In FIG. 9A, when the n-th cutout is formed, heating with the laser cutting causes the thermal-expansion deformation in the right-hand cut face of the segment 53 as viewed in the figure. At this time, however, since the left-hand side of the portion 53 later becoming a segment, as viewed in the figure, is not yet disconnected from the metallic plate 51, i.e., the basic material, a thermal deformation in the y-axis direction is suppressed. As a result of suppression of the y-directional thermal deformation, the right-hand cut face of the portion 53 later becoming a segment is plastically deformed in the direction of contraction. When the metallic plate 51 is cooled and the temperature of the cut face is lowered after completion of the n-th laser cutting, the right-hand cut face of the segment 53 is going to restore to the original dimension with elimination of the thermal-expansion deformation existing so far. However, since the right-hand cut face of the portion 53 later becoming a segment is contracted in length due to the above plastic deformation caused during the laser cutting, the elastic strain in the direction of tension and the plastic strain in the direction of compression are left in the right-hand cut face (see FIG. 8C).

Then, when the (n+1)-th cutout 62 is gradually cut by irradiation of a laser beam as shown in FIG. 9B, the left-hand cut face of the segment 53 is going to extend by the thermal-expansion deformation. At this time, since the segment 53 is disconnected from the segment 53, the thermal-expansion deformation is not suppressed. Accordingly, the segment 53 is freely curved to the right as viewed in the figure (i.e., in the negative direction of the x-axis), but no appreciable plastic deformation is caused in the cut face. When the temperature of the metallic plate 51 is lowered after completion of the (n+1)-th laser cutting, the thermal-expansion deformation caused in the left-hand cut face of the segment 53 is disappeared and the left-hand cut face of the segment 53 restores to the original dimension.

Thus, referring to FIG. 9C which is a sectional view taken along line C—C in FIG. 9B, the elastic strain in the direction of tension is left in the right-hand cut face of the segment 53, but no strain is generated in the left-hand cut face of the segment 53. When there occurs a strain imbalance between the cut faces on both the sides like this case, the strain is redistributed between both the sides to be balanced. As a result, the elastic strain in the direction of tension in the right-hand cut face of the segment 53 is reduced to about ½ of the original value and, corresponding to this reduction, an elastic strain in the direction of tension is caused in the left-hand cut face of the segment 53. This means that the distal end of the segment 53 is deformed in the plane of the metallic plate 51; namely, the segment 53 is curved to the right in the figure (i.e., in the clockwise direction).

The above description is made of the case where the cutting is advanced in the positive y-direction. When the cutting is advanced in the negative y-direction, the distal end of the segment 53 is also curved to the right in the figure in the plane of the metallic plate 51 although the extent by which the distal end is curved is smaller.

In processing a lead frame, when the laser cutting is performed with inner portions of individual inner leads disconnected at their distal ends from one another, the inner leads are curved or so in accordance with the principle similar to that described above. In this embodiment, however, since the laser cutting is performed with the joint portion 7 left so as to interconnect the inner portions 3a of the inner leads at their distal ends, the conditions under which strains remain are the same in both cut faces of the inner portion 3a of each inner lead (e.g., the left- and right-hand cut faces of the segment 53 in FIG. 9C), whereby the occurrence of thermal deformations is suppressed to prevent the inner leads 3 from being curved or so in the plate plane.

Meanwhile, it is described in JP, A, 59-72754 that, by leaving a joint portion interconnecting inner leads at near their distal ends when a lead frame is formed by not laser cutting but pressing, release of processing strains generated during the pressing is suppressed to prevent deformations of the leads and lead positions are not shifted even with heat treatment or the like effected to remove the processing strains. Because gaps for separating leads from each other are formed at the same time by the pressing, processing strains generated during the pressing are inherently ones in the direction of plate thickness. In the prior art, therefore, the joint portion is provided and the heat treatment is applied for the purpose of primarily removing such processing strains in the direction of plate thickness. On the contrary, the inventor has found the presence of strain imbalance occurred between both sides (see FIG. 9C) of the segment (lead) when the segment is formed by the laser cutting as one kind of thermal processing as shown in FIGS. 9A and 9B, i.e., the presence of strain imbalance that is never occurred by the pressing. In other words, the above-described strain imbalance is a problem occurred only when lead frames are formed by the laser cutting. To eliminate such a strain imbalance and prevent the inner leads from being curved or so, the joint portion is left near the distal ends of the inner leads in the present invention.

It is desired that, after the laser cutting in step S120, the strain which has been caused inevitably is removed by coining or the like.

Figure 10:
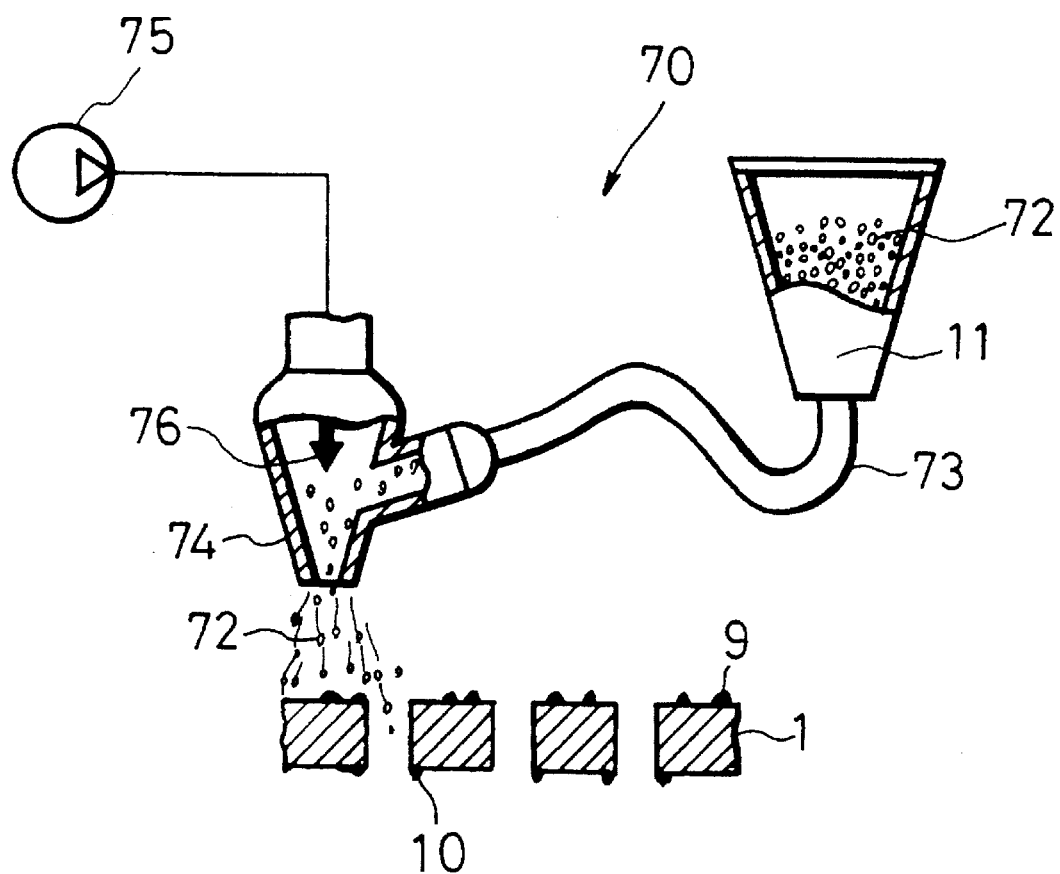
FIG. 10 is a view of a minute particulate ejecting apparatus used for mechanical surface treatment in step S130 in FIG. 2.

Next, in step S130, mechanical surface treatment is carried out to remove the dross and spatters deposited on the lead frame 1 during the laser cutting. FIG. 10 shows a minute particulate ejecting apparatus (hereinafter referred to as shot blasting apparatus) for use in the mechanical surface treatment. In a shot blasting apparatus 70 shown in FIG. 10, minute particulates 72 stored in a particulate tank 71 are supplied to a particulate nozzle 74 through a pipe 73, and are accelerated by high-pressure air 76 from a high-pressure air source 75 to be ejected from a distal end of the particulate nozzle 74. The ejected minute particulates 72 collide the lead frame 1 at a high speed so that spatters 9, dross 10, etc. deposited during the laser cutting are removed with kinetic energy of the minute particulates. This step is application of the technology employed to deburr parts mechanically processed with high precision. The particulate nozzle 74 is moved (scanned) along the entire portion which has been laser-cut, for removing all of the spatters 9, dross 10, etc. to thereby clean the plate surface. Simultaneously, an oxide film formed on the plate surface by the irradiation of the laser beam can also be removed to some extent. While the shot blasting apparatus 70 of FIG. 10 is arranged to eject the minute particulates 72 from one side of the lead frame 1, the shot blasting apparatus of the illustrated construction may be disposed on each side of the lead frame 1.

The minute particulates 72 used at this time has a particle size smaller than the minimum gap between the leads (inner leads) of the lead frame 1. Therefore, the minute particulates 72 can pass any gaps between the leads and, even if a very large size of dross, for example, is deposited on the end surface of any lead, the dross can be readily and surely removed with high efficiency and reduced cost. Even with the minute particulates 72 ejected to collide against only one side of the lead frame 1, the minute particulates 72 pass the gaps between the leads and go on up to the opposite side of the lead frame 1, thereby processing the opposite surface as well to some extent.

Subsequently, in step S140, chemical surface treatment is carried out to clean the surfaces of the lead frame. More specifically, chemical polishing as one kind of chemical surface treatment methods is then applied to the surfaces of the lead frame 1 to dissolubly remove a number of fine flaws and irregularities caused during the mechanical surface treatment by the shot blasting apparatus 70 so that the plate surfaces are made smooth and clean. At the same time, the oxide films formed on the plate surfaces by the irradiation of the laser beam can also be removed completely. The chemical polishing is performed, as with conventional chemical polishing, by a method of immersing the lead frame 1, which has been processed by the shot blasting apparatus 70, in a chemical polishing solution within a chemical polishing tank for a predetermined period of time.

In the case of processing a thin metallic plate to manufacture a lead frame having a number of pins and a small pitch, if the individual inner leads 3 are separated from one another without providing the joint portion 7 at the inner distal ends of the inner leads 3, each lead would be extremely thin and its rigidity is remarkably reduced, making it difficult to handle the lead frame. On the contrary, since the joint portion 7 (see FIG. 7) is left so as to interconnect the distal ends of the inner leads 3 during the mechanical surface treatment in step S130 and the chemical surface treatment in step S140 of this embodiment, the inner leads 3 are mutually fixed and restricted and hence the rigidity is maintained. Accordingly, the inner leads 3 can be prevented from being disordered in their array, whereby handling of the lead frame 1 is facilitated and the dimensional accuracy thereof is maintained.

Figure 11:
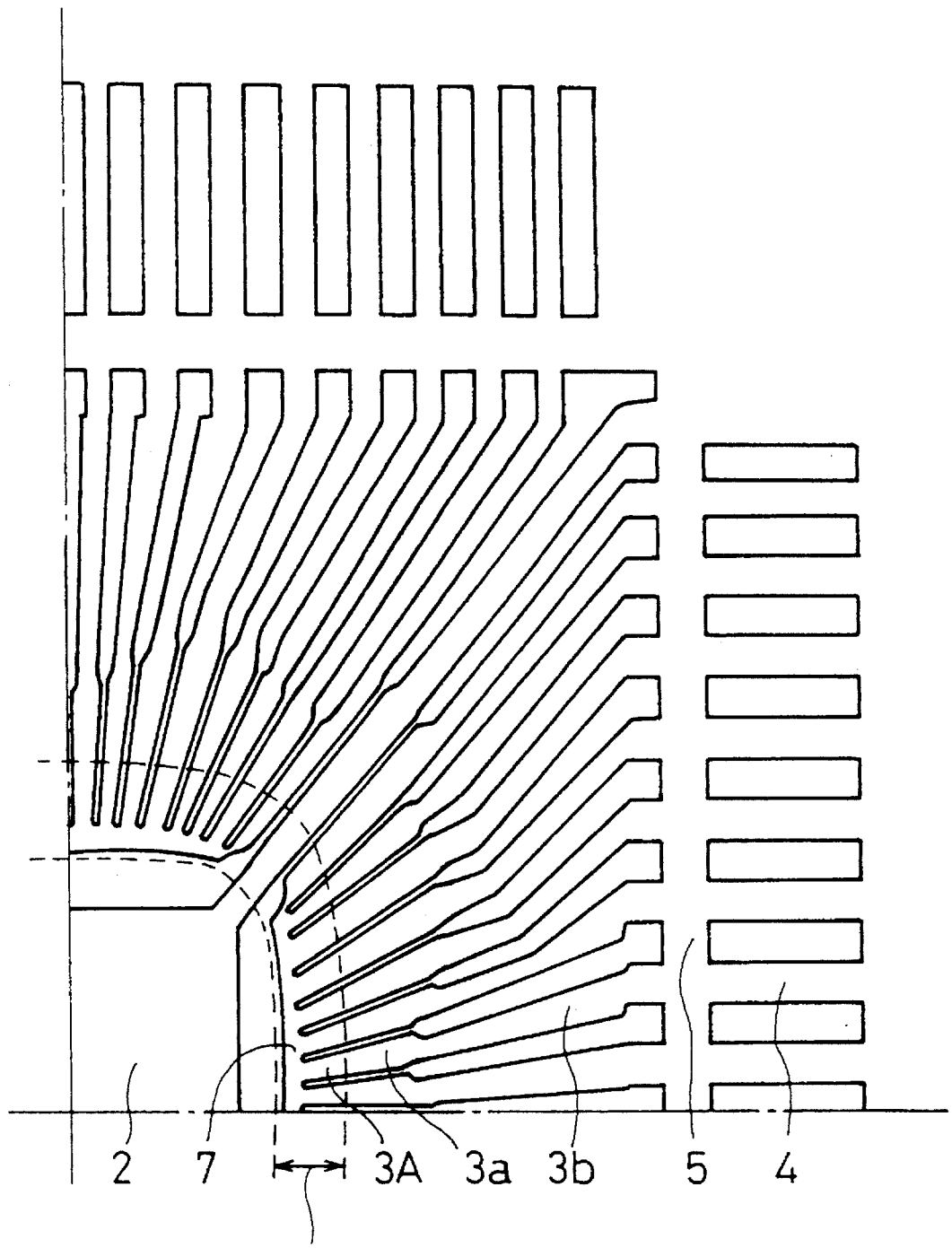
FIG. 11 is a view showing the surface configuration of the lead frame at the end of step S153 in FIG. 2.

Next, in step S150 in FIG. 2, a protective film for gold plating is coated over the region other than inner portions of the inner leads 3 (hereinafter referred to as connecting portions of the inner leads 3) connected to respective terminals of the semiconductor chip. As the protective film for gold plating is used a coating agent based on, e.g., oils/fats and synthetic resins. The gold plating is then carried out in step S151. Gold is plated on the connecting portions of the inner leads 3 which have not been coated with the protective film for gold plating, thereby forming plated terminal portions 3A. Subsequently, the protective film for gold plating is removed in step S152 using oils/fats, solvents or the like. Further, the lead frame is washed and dried in step S153. FIG. 11 shows the surface configuration of the lead frame 1 at the end of step S153. Instead of the gold plating, silver or copper plating may be carried out. Such a plating process is intended to improve the joining strength between the respective terminals of the semiconductor chip and the inner leads.

Figure 12A:
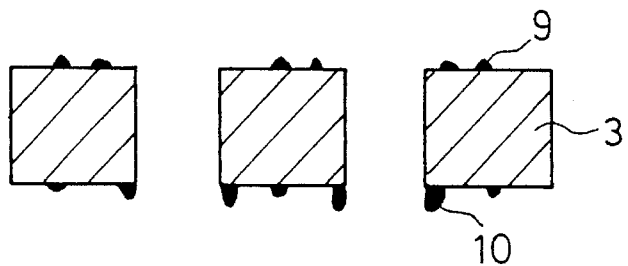
FIG. 12A is a sectional view of an inner lead in the condition that spatters and dross are deposited on the lead surface.
Figure 12B:
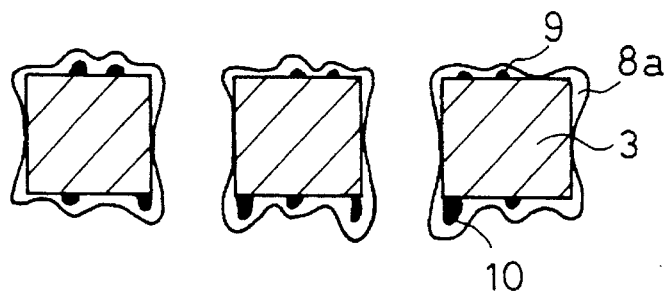
FIG. 12B is a sectional view of the inner lead when the lead in the condition of FIG. 12A is subject to plating.

A description will now be made of the case of carrying out the above plating process under the condition that the spatters and dross remain deposited on the inner lead surfaces without executing the mechanical surface treatment in step S130 and the chemical surface treatment in step S140. As shown in FIG. 12A, if the spatters 9 and the dross 10 are deposited on the surfaces of the inner leads 3, a plating layer 8a would be grown concentratedly on the portions projecting by the presence of the spatters 9 and the dross 10 to thicken locally on those projected portions, as shown in FIG. 12B. This would lead to difficulties in obtaining a sufficient thickness required for the plating layer in other portions. Stated differently, in that case, irregularities of the surface of the lead frame 1 would be enlarged to make the plating layer uneven in thickness. Further, the plating layer on the projected portions where the dross and spatters are deposited might be abnormally swollen to such an extent that the gap between the leads would be filled with the plated metal to cause a short-circuit between the adjacent leads. The lead frames on which such an event has occurred can no longer be repaired and employed as products.

Figure 13A:
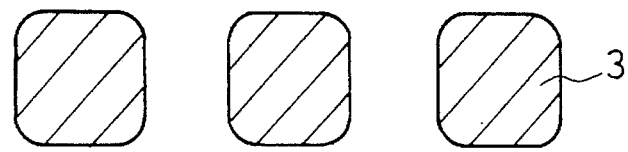
FIG. 13A is a sectional view of the inner lead in the condition after the mechanical surface treatment in step S130 and chemical surface treatment in step S140 in FIG. 2.
Figure 13B:
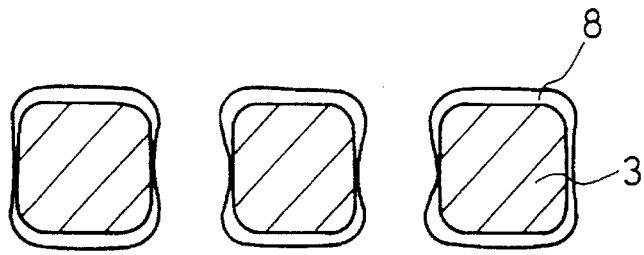
FIG. 13B is a sectional view of the inner lead when the lead in the condition of FIG. 13A is subject to plating.

As opposed to the above case, since the plating process is carried out in this embodiment after the mechanical surface treatment in step S130 and the chemical surface treatment in step S140, the plating process is effected on the clean surfaces of the inner leads 3 which are free from any of dross, spatters and oxide films, as shown in a sectional view of FIG. 13A. After the plating process, therefore, a satisfactory plating layer 8 being uniform in thickness can be formed, as shown in FIG. 13B, with the result of improved adhesion of the plating layer 8. By so applying the satisfactory plating layer 8 on the surface of each inner lead 3, the joining strength between the respective terminals of the semiconductor chip and the inner leads is enhanced. Consequently, the incidence of failed products is lowered and the yield is improved.

Further, since the plating process is carried out after the laser cutting in step S120, any of spatters, dross, oxide films and other dirt is not deposited on the plating layer and the quality of the plating layer is not degraded.

Additionally, since the joint portion 7 (see FIG. 7) is still left in steps S150 to S153 so as to interconnect the distal ends of the inner leads 3 as with step S130 and step S140, the inner leads 3 are mutually fixed and restricted and hence the rigidity is maintained. At this time, accordingly, the inner leads 3 are also prevented from being disordered in their array, whereby handling of the lead frame 1 is facilitated and the dimensional accuracy thereof is maintained.

Figure 14:
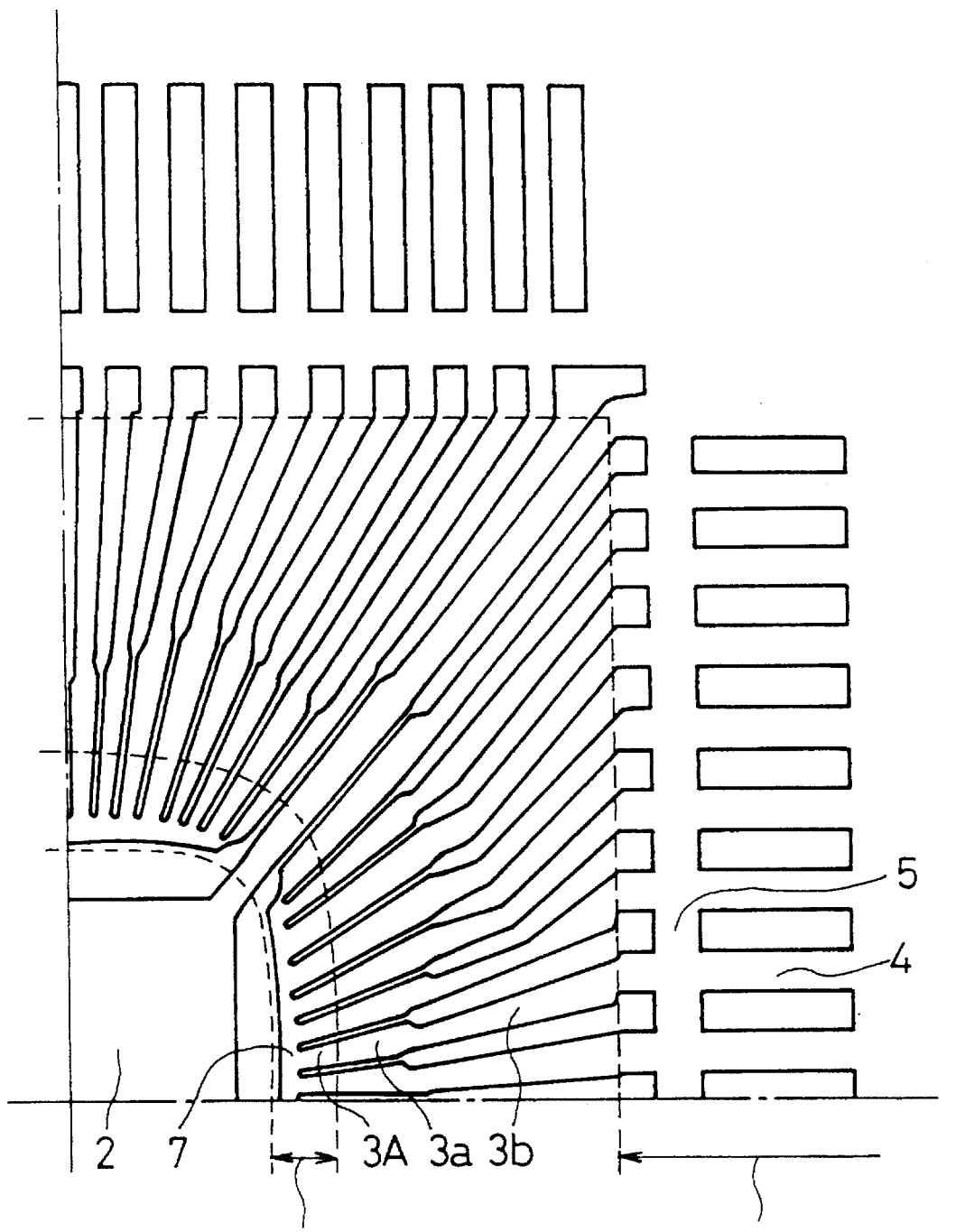
FIG. 14 is a view showing the surface configuration of the lead frame at the end of step S161 in FIG. 2.

Next, in step S160 in FIG. 2, a protective film for solder plating is coated over the region other than the outer leads 4, including the connecting portions of the inner leads 3 which are plated with gold. As the protective film for solder plating is used a coating agent based on, e.g., oils/fats and synthetic resins similarly to the protective film for gold plating. The solder plating is then carried out in step S161. Solder is plated on the outer leads 4 which have not been coated with the protective film for solder plating. FIG. 14 shows the surface configuration of the lead frame 1 at the end of step S161.

Such a solder plating process is intended to improve the joining strength between the outer leads and a circuit pattern when a semiconductor device is mounted to the surface of a printed board. Further, since the joint portion 7 (see FIG. 7) is still left in step S160 and step S161 so as to interconnect the distal ends of the inner leads 3 as with step S130, step S140 and steps S150 to S153, the inner leads 3 are mutually fixed and restricted and hence the rigidity is maintained. At this time, accordingly, the inner leads 3 are also prevented from being disordered in their array, whereby handling of the lead frame 1 is facilitated and the dimensional accuracy thereof is maintained.

Figure 15:
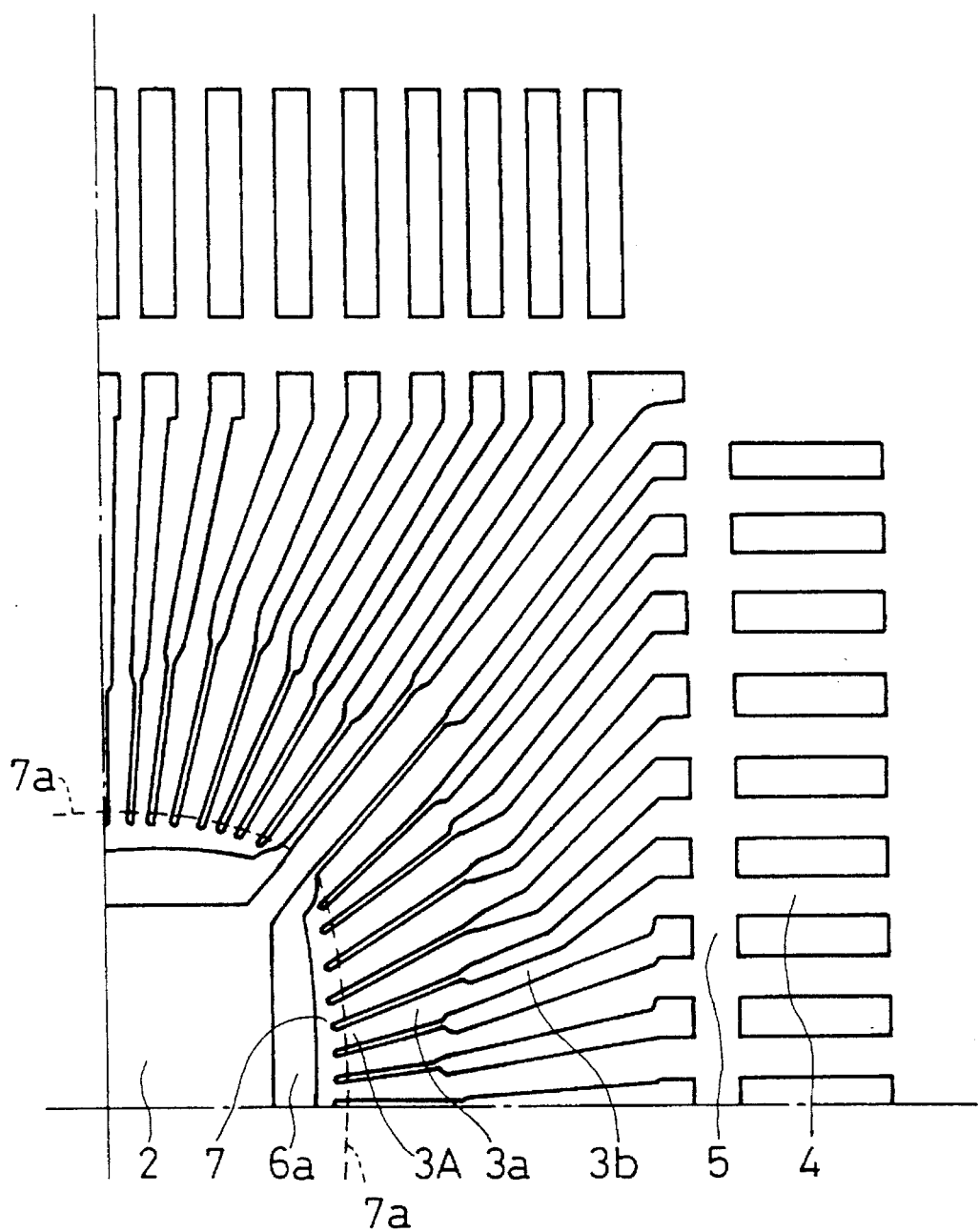
FIG. 15 is a view showing the position where a joint portion is cut off by laser cutting in step S170 in FIG. 2.
Figure 16:
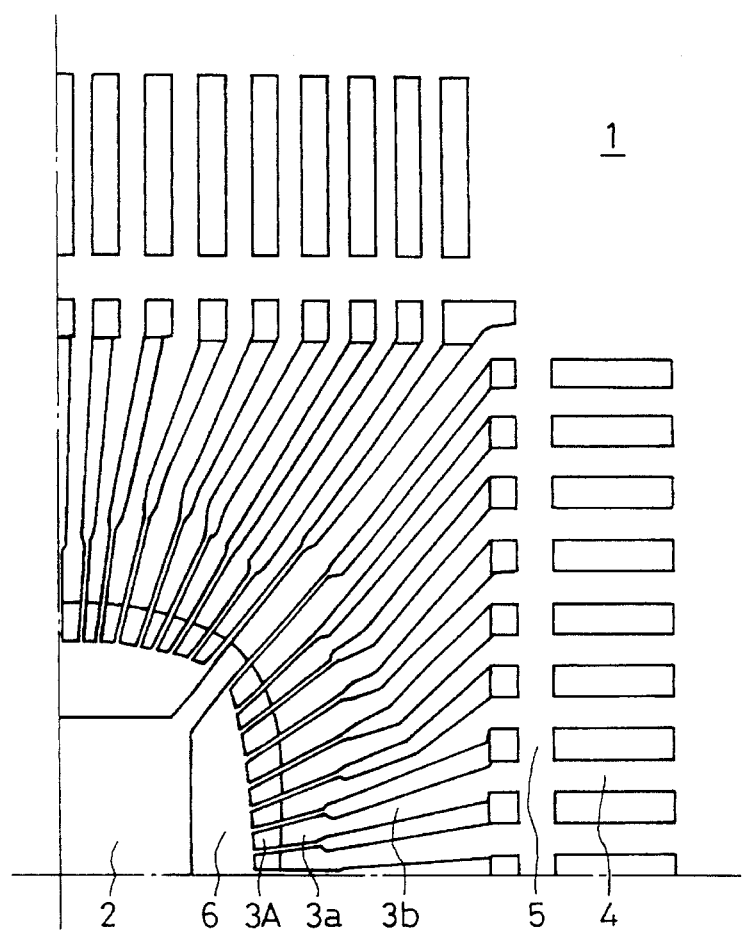
FIG. 16 is a view showing the condition that a final lead frame pattern is formed after the laser cutting at the position indicated in FIG. 15.

Next, in step S170 in FIG. 2, the joint portion 7 left at the distal ends of the inner leads 3 is cut off by irradiating a laser beam along a cutting path 7a shown in FIG. 15. Thereby, as shown in FIG. 16, the inner leads 3 are separated from one another, the notches 6 are defined, and a final lead frame pattern is formed. Note that, for the sake of brevity, the gold-plated region and the solder-plated region are not indicated in FIG. 15. By utilizing a laser beam to cut off the joint portion 7 as explained above, the joint portion 7 can be easily cut off with high accuracy. The inner leads 3 separated from one another are electrically connected to respective terminals of a semiconductor chip which is later mounted on the die pad 2.

While the joint portion 7 is cut off by thermal processing, the spread of heat induced by the irradiation of a laser beam is limited to a small region near the distal end of each inner lead 3 and, therefore, the inner leads 3 are not curved or so due to thermal deformations unlike the above-described case of forming the gaps 3c to divide the inner portions 3a of the inner leads individually. Further, although the molten metal is scattered as spatters at the time of cutting off the joint portion 7 by a laser beam, these spatters are deposited on the protective film for solder plating together with other dirt, dust, etc. The joint portion 7 may be cut off by non-thermal processing such as punching by a press. The dirt and so on generated during the punching is also deposited on the protective film for solder plating.

Then, in step S180, the protective film for solder plating coated in step S160 is removed using oils/fats, solvents or the like. The spatters, dirt and dust which have been deposited on the protective film for solder plating at the time of cutting off the joint portion 7 in step S170 are all removed together with the protective film. Subsequently, in step S181, the lead frame 1 from which the protective film for solder plating has been removed is washed and dried. The surfaces of the lead frame 1 are thereby made clean.

After that, the lead frame 1 is inspected for, e.g., its outer appearance and configuration in step S190, and packed in step S191, thereby completing the manufacture of the lead frame.

Figure 17:
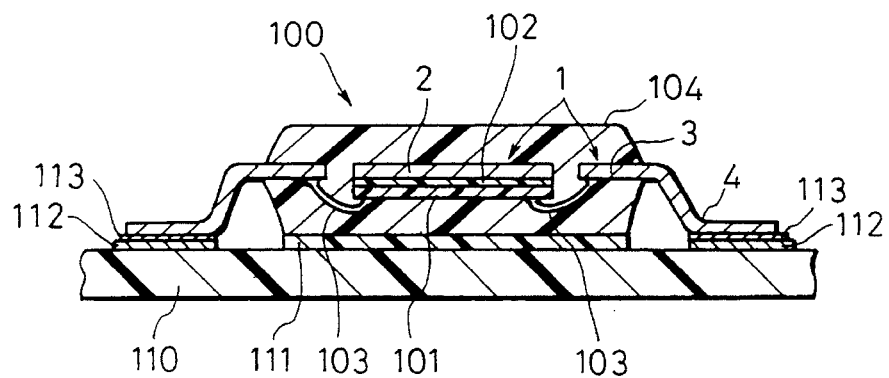
FIG. 17 is a sectional view showing one example of a semiconductor device employing the lead frame of FIG. 1.

A description will now be made of one example of a semiconductor device employing the lead frame processed as described above. As shown in FIG. 17, a semiconductor chip 101 is bonded to the die pad 2 of the lead frame 1 by an adhesive 102, and the distal ends of the inner leads 3 are connected to corresponding terminals of the semiconductor chip 101 by respective conductive wires 103. Then, the semiconductor chip 101, the die pad 2 and the inner leads 3 are integrally molded by a resin molding 104. Further, the dam bars 5 and unnecessary peripheral portions of the lead frame 1 (see FIG. 1) are cut, followed by bending the outer leads 4. A semiconductor device 100 thus constructed is fixed to a predetermined position on a printed board 110 by an adhesive 111, and the outer leads 4 are connected by solder 113 to lands 112 provided following a circuit pattern on the printed board 110.

Another example of the semiconductor device employing the lead frame processed as described above will now be explained.

A semiconductor device of this example is based on the Lead-On-Chip (hereinafter abbreviated to LOC) method by which inner leads are directly connected to corresponding terminals of a semiconductor chip. In semiconductor devices, a semiconductor chip and inner leads are generally interconnected by the wire bonding method shown in FIG. 17 and, therefore, each inner lead requires a width not less than a certain value. This has been an obstacle in reducing the size of semiconductor devices and increasing a degree of integration and density thereof. On the other hand, the LOC method can further reduce the width and the pitch of inner leads, enabling semiconductor devices to be reduced in size and increased in a degree of integration and density.

Hitherto, in most cases, the LOC method has been employed in semiconductor devices of the TAB (Tape Automated Bonding) type using a polyimide film on which leads are formed by Cu foils, and has been adapted for semiconductor chips of the very fine structure in which inner leads have an extremely small pitch. With this embodiment, since the inner leads can have a much smaller pitch than conventional to provide the lead frame with highly accurate dimensions and configurations, the lead frame can be connected to terminals of a semiconductor chip by the LOC method as with the conventional TAB type devices, and semiconductor devices being small in pitch comparable to the TAB type devices can be realized.

Figure 18A:
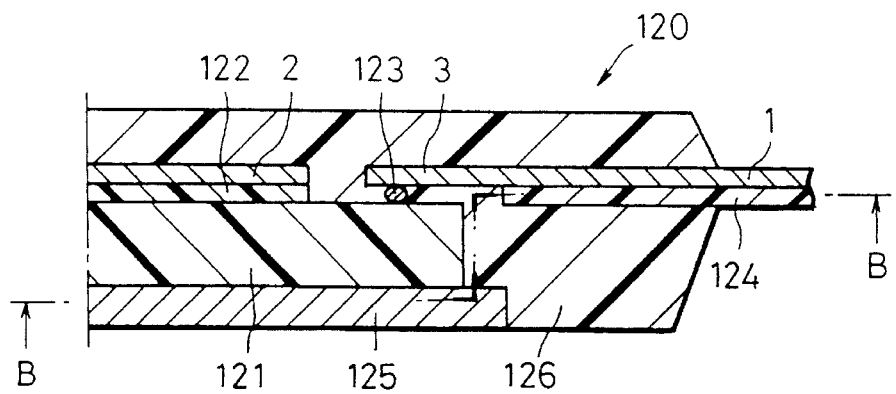
FIG. 18A is a sectional view of a ½ portion of the semiconductor device.
Figure 18B:
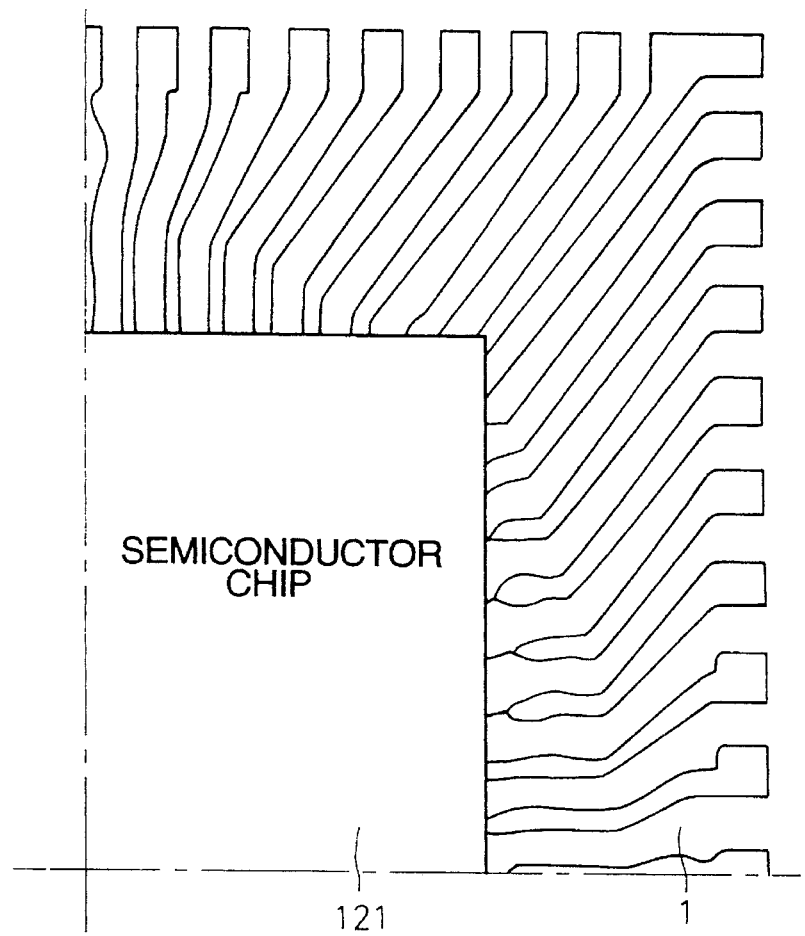
FIG. 18B is a view as viewed in the direction indicated by B—B in FIG. 18A.

In a semiconductor device 120, as shown in FIGS. 18A and 18B, a semiconductor chip 121 is bonded to a rear surface of the die pad 2 of the lead frame 1 by an adhesive 122, and terminals of a semiconductor chip 121 are connected to corresponding ends of the inner leads 3 of the lead frame 1 by respective gold bumps 123. The inner leads 3 are reinforced by a reinforcing film 124. Additionally, a heat radiating plate 125 is attached to a rear surface of the semiconductor chip 121, allowing the heat generated in the semiconductor chip 121 to be released through the heat radiating plate 125. The semiconductor chip 121 and other members thereabout are integrally sealed off by a resin molding 126.

The semiconductor device thus constructed has advantages below.

(1) Since the lead frame 1 has strong rigidity and high dimensional accuracy, there occur neither position shifts nor deformations after the processing.

(2) Since the semiconductor chip 121 is protected by the die pad 2, the device is highly resistant against external disturbances.

(3) It is possible to easily realize the structure that the heat radiating plate 125 is attached to the rear surface of semiconductor chip 121 which radiates heat. The provision of the heat radiating plate 125 is effective not only to enhance heat radiation from the semiconductor device, but also to improve resistance against noise, ultraviolet rays and radiative rays. The heat radiating plate may be attached to both sides of the semiconductor chip 121 rather than one side. In the case of the semiconductor chip radiating heat in not so large amount, the heat radiating plate may be dispensed with.

In the structure as shown in FIG. 18A, since the lead frame is disposed on an upper surface of the semiconductor chip 121, the die pad 2 is not necessarily essential and can be omitted when outer disturbances to the semiconductor chip 121 are not so problematic.

Figure 19:
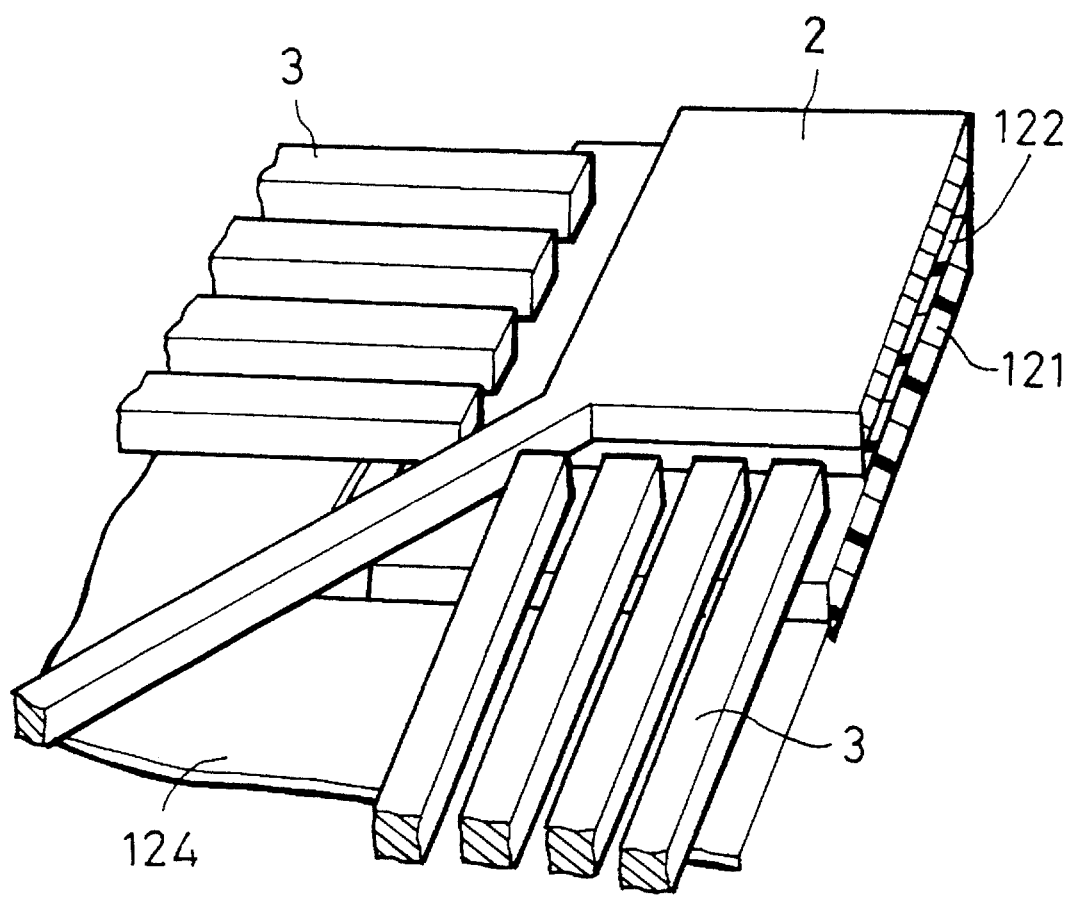
FIG. 19 is a perspective view of connecting portions between a semiconductor chip and the inner leads in the semiconductor device of FIG. 18 before molding.

FIG. 19 is a perspective view of connecting portions between the semiconductor chip and the inner leads 3 before they are sealed off by the resin molding 126. Since the inner leads 3 have a small pitch and a narrow width as described above, they are reinforced by the reinforcing film 124 to prevent deformations and tangling thereof.

According to this embodiment described above, since the laser cutting is performed under the condition that the joint portion 7 is left so as to interconnect the inner portions 3a of the inner leads at their distal ends, the occurrence of thermal deformations incidental to the laser cutting is suppressed and the inner leads are prevented from being curved or so in the plate plane, whereby highly accurate processing is ensured.

Also, under the condition that the inner leads 3 are mutually fixed and restricted by the joint portion 7 and hence the rigidity is maintained, the outer portions 3b of the inner leads and the outer leads 4 are formed, the mechanical surface treatment and the chemical surface treatment for removing foreign matters such as dross generated with the laser cutting are performed, the plated terminal portions 3A are formed by plating gold on the connecting portions of the inner leads 3, and solder is plated on the outer leads 4. In carrying out each of those steps, therefore, the inner leads 3 are prevented from being disordered in their array, whereby handling of the lead frame 1 is facilitated and the dimensional accuracy thereof is maintained.

Since foreign matters such as dross are removed by the mechanical surface treatment and the chemical surface treatment, the surfaces of the inner leads 3 can be made clean. Further, since the plated terminal portions 3A are formed by plating gold on the connecting portions of the inner leads 3 after removing foreign matters such as dross by the mechanical surface treatment and the chemical surface treatment, the gold plating is applied to the surfaces of the inner leads 3 in clean condition, and the satisfactory plated terminal portions 3A having good adhesion can be obtained.

Since the protective film for solder plating is coated over the region other than the outer leads 4, including the plated terminal portions 3A, the surfaces of the plated terminal portions 3A are protected and also dirt, spatters, etc. generated when cutting off the joint portion 7 are deposited on the protective film for solder plating. With the protective film for solder plating removed thereafter, the dirt, spatters, etc. deposited on the protective film can be all removed together.

Since a laser beam is utilized to cut off the joint portion 7, the joint portion 7 can be easily cut off with high accuracy. In this case, while thermal processing is employed, the spread of heat induced by the irradiation of a laser beam is limited to a small region near the distal end of each inner lead and, therefore, the inner leads 3 are not curved or so in the plate plane due to thermal deformations.

Further, since non-thermal processing such as etching or punching by a press is more efficient than the laser cutting, by combining both the processing methods, i.e., the non-thermal processing and the laser cutting, with each other depending on the portion to be processed like this embodiment, the portion to be laser-cut can be limited to a necessary and minimum extent, and hence the highly accurate lead frame can be processed with high efficiency.

In addition, with this embodiment, since the lead frame having a small pitch can be processed with high accuracy, it is possible to further reduce the size of semiconductor devices and to increase a degree of integration and density thereof, by making use of such a feature.

SECOND EMBODIMENT

A second embodiment of the present invention will be described below with reference to FIGS. 20 and 21.

In this embodiment, after laser-cutting the fine inner portions 3a of the inner leads 3, the outer leads 4, the outer portions 3b of the inner leads 3 which are not so fine, and the notches 6a (see FIG. 4) are processed.

Figure 20:
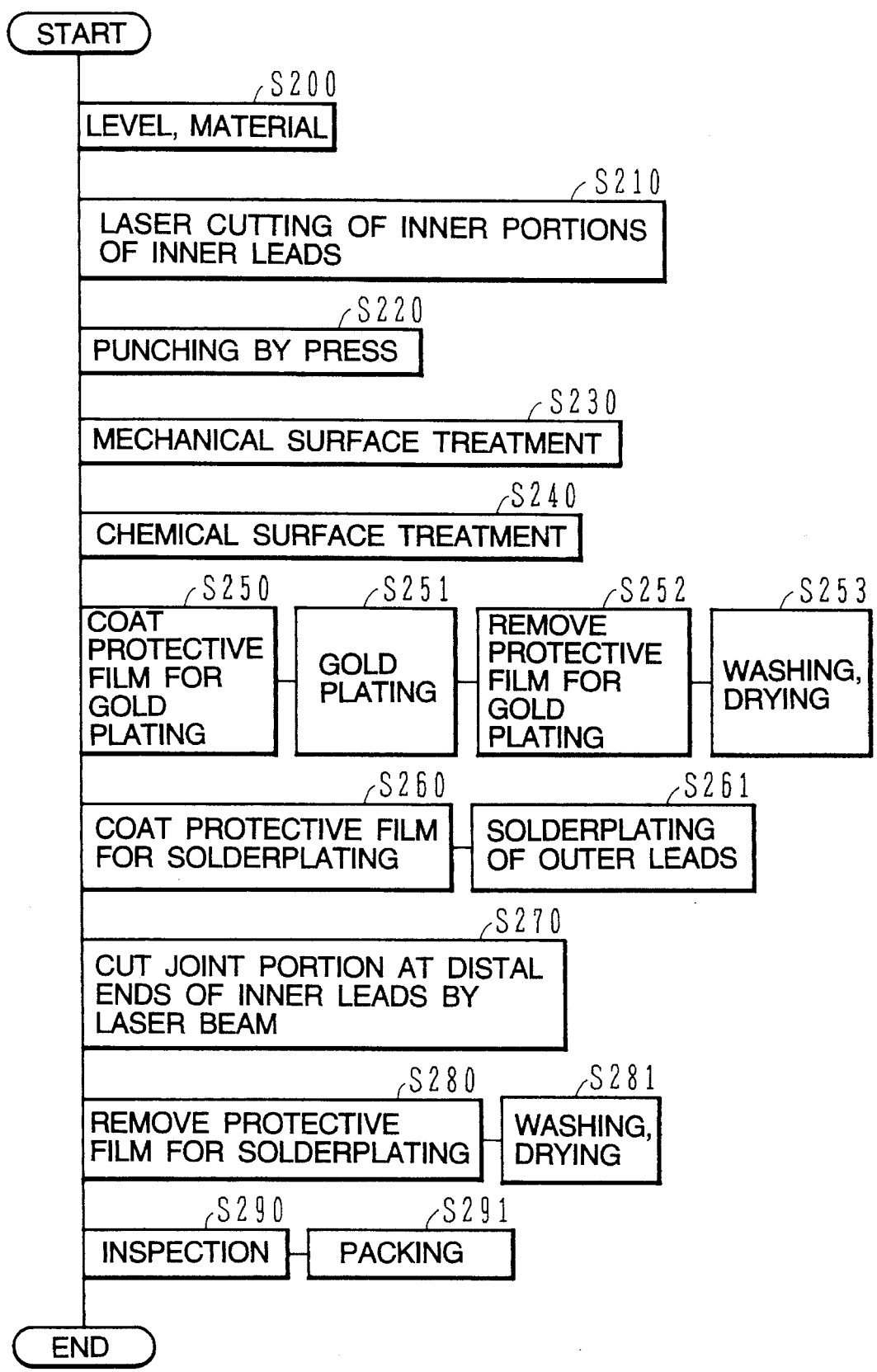
FIG. 20 is a chart showing manufacture steps of a lead frame according to a second embodiment of the present invention.
Figure 21:
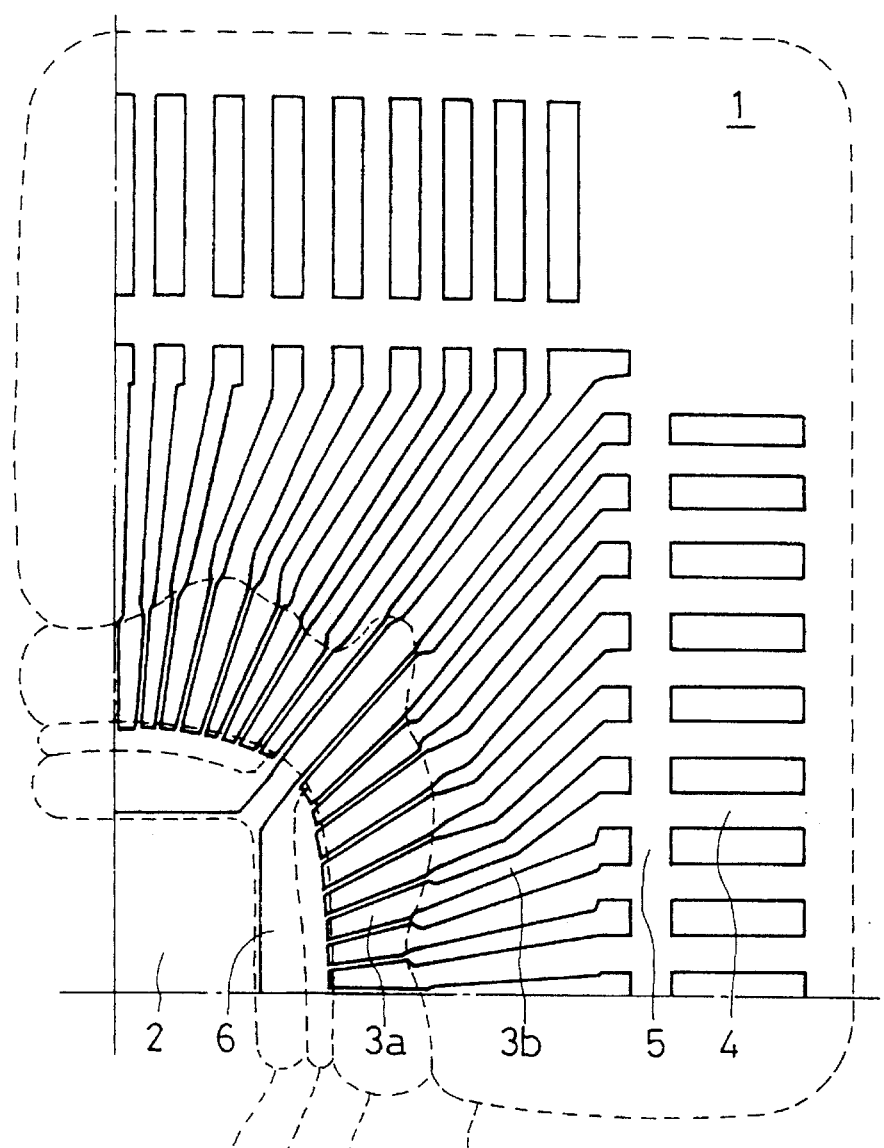
FIG. 21 is a view of a ¼ portion of the lead frame processed in step S120, step S220 and step S270 in FIG. 20.

First, in step S200 in FIG. 20, a metallic plate material is leveled by being fed through a leveler, as in step S100 in FIG. 2, to correct curves of the material and to obtain a flat plate.

Then, in step S210, laser cutting is carried out on the metallic plate as in step 120 in FIG. 2. The gaps 3c dividing the fine inner portions 3a of the inner leads 3 individually are thereby defined in the form of slits as shown in FIG. 21. At this time, the laser cutting is performed under the condition that the inner portions 3a of the inner leads are not disconnected from one another. As with the above embodiment, therefore, the occurrence of thermal deformations incidental to the laser cutting is suppressed and the inner leads are prevented from being curved, distorted or so in the plate plane.

Subsequently, in step S220, press-punching is carried out on the metallic plate laser-cut as above. Specifically, the outer leads 4 and the outer portions 3b of the inner leads 3 which are not so fine in extended relation to the fine inner portions 3a of the inner leads 3, further the notches 6a (see FIG. 4) are punched by a press, as shown in FIG. 21. As a result of the punching, at the same time when the notches 6a are formed, the joint portion 7 (see FIG. 7) is left at the distal ends of the inner portions 3a of the inner leads. In this step, the portions which are essentially the same as those etched in steps S110 to S112 in FIG. 2 are processed. Note that the etching process similar to that in steps S110 to S112 in FIG. 2 may be employed instead of the pressing process.

In subsequent steps S230 to S261, mechanical surface treatment, chemical surface treatment, gold plating, solder plating and so forth are carried out as in steps S130 to S161 in FIG. 2.

Next, in step S270, the joint portion 7 left at the distal ends of the inner leads 3 is cut off by irradiating a laser beam as in step S170 in FIG. 2. A final lead frame pattern as shown in FIG. 21 is thereby formed. Note that, for the sake of brevity, the gold-plated region and the solder-plated region are not indicated in FIG. 21. Similarly to the foregoing embodiment, the joint portion 7 may be cut off by non-thermal processing such as punching by a press.

Then, in step S280, the protective film for solder plating is removed using oils/fats, solvents or the like as in step S180. The spatters, dirt and dust which have been deposited on the protective film for solder plating at the time of cutting off the joint portion 7 in step S170 are all removed together with the protective film. Subsequently, in step S281, the lead frame 1 from which the protective film for solder plating has been removed is washed and dried. The surfaces of the lead frame 1 are thereby made clean.

After that, the lead frame 1 is inspected for, e.g., its outer appearance and configuration in step S290, and packed in step S291, thereby completing the manufacture of the lead frame.

This embodiment thus constructed can also provide similar advantages to those in the above embodiment.

THIRD EMBODIMENT

A third embodiment of the present invention will be described below with reference to FIG. 22.

In this embodiment, the mechanical surface treatment in step S130 in FIG. 2 is carried out by using grinding belts in each of which minute particulates are attached to one side of the belt.

Figure 22:
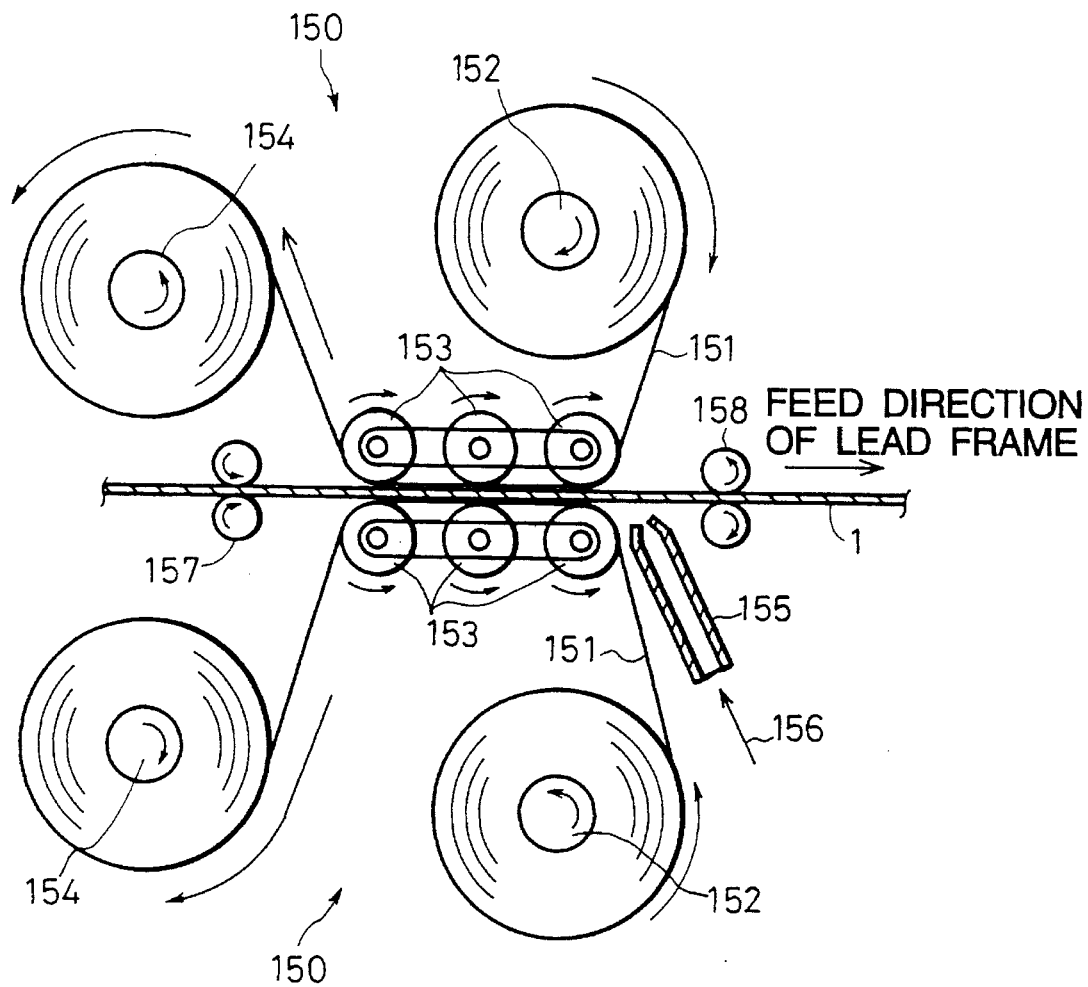
FIG. 22 is a view of a surface treating apparatus of the grinding belt type for use in mechanical surface treatment in a third embodiment of the present invention.

In FIG. 22, a surface treating apparatus 150 of the grinding belt type includes a pair of grinding belts 151 to one side of which minute particulates are attached and which are arranged to hold the lead frame 1 from both sides. Each grinding belt 151 is unrolled from a let-out roll 152 and is pressed by pressing rolls 153 under a certain force to grind the surface of the lead frame 1. After removing the spatters and dross, the grinding belt 151 is wound over a wind-up roll 154. In the above arrangement, the grinding belt 151 is advanced in a direction opposite to the feed direction of lead frame 1, and a predetermined tension is applied to the lead frame 1 by a combination of a tension applying roll 157 upstream of the pressing rolls 153 and a feed roll 158 downstream of the pressing rolls 153. As a result, the efficiency of grinding both sides of the lead frame 1 is improved so that the spatters and dross are surely removed.

Further, a grinding liquid 156 is supplied from a grinding liquid supply nozzle 155 to a back side of the grinding belt 151 on which difficult-to-remove spatters and dross are more like to deposit. By so supplying the grinding liquid 156, the lead frame 1 and the grinding belt 151 contact with each other under better condition to increase a grinding ability of the grinding belt. The grinding liquid may be supplied to not only the back side of the grinding belt 151, but also a front side thereof. If minute particulates are supplied with the grinding liquid 151, the grinding efficiency is further improved.

While the illustrated embodiment is arranged as feeding the grinding belt and winding up it in one direction, a long endless grinding belt with its both ends coupled to each other may be employed and continuously circulated. It is also possible to employ felt cloth instead of the grinding belt, and to spray a grinding liquid mixed with abrasive grains to the felt cloth so that each surface of the lead frame 1 is mechanically treated by the felt cloth.

The processing method other than the foregoing is similar to that in the embodiment previously described with reference to FIGS. 1 to 19.

This embodiment constructed as above can also provide similar advantages to those in the embodiment described with reference to FIGS. 1 to 19.

FOURTH EMBODIMENT

A fourth embodiment of the present invention will be described below with reference to FIG. 23.

Figure 23:
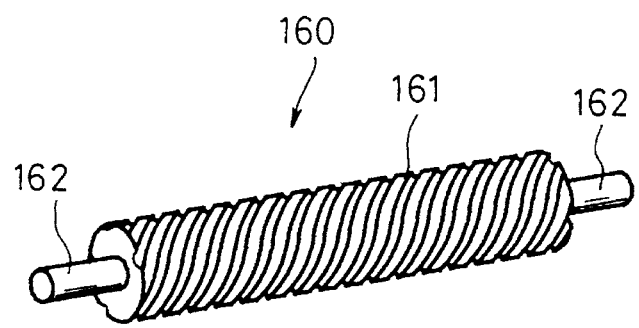
FIG. 23 is a view of a cylindrical cutter for use in mechanical surface treatment in a fourth embodiment of the present invention.

In this embodiment, the mechanical surface treatment in step S130 in FIG. 2 is carried out by using a grinding machine which has a cylindrical cutter, as shown in FIG. 23.

In FIG. 23, a cylindrical cutter (hereinafter referred to as plane milling cutter) 160 is a tool which includes a spiral blade 161 and has rotary support shafts 162 at both ends. A grinding machine constructed by supporting the rotary support shafts 162 by suitable bearings and driving the cutter to rotate about its own axis is employed instead of the shot blasting apparatus 70 shown in FIG. 10 or the surface treating apparatus 150 of the grinding belt type shown in FIG. 22. By using the plane milling cutter 160, the spatters and dross which are deposited on the lead frame 1 in the projected form can be selectively ground and removed. The processing method other than the foregoing is similar to that in the embodiment previously described with reference to FIGS. 1 to 19.

This embodiment constructed as above can also provide similar advantages to those in the embodiment described with reference to FIGS. 1 to 19.

FIFTH EMBODIMENT

A fifth embodiment of the present invention will be described below with reference to FIG. 24.

If the width $W_1$ of the opening 14 is sufficiently greater than the thickness $t_0$ of the metallic plate 11 as with the above-described case shown in FIG. 3, the exposed surfaces of the metallic plate 11 are satisfactorily contacted with the etchant so that the through-hole 14a may be quickly formed. This corresponds to the case of etching the outer leads and the outer portions of the inner leads which are not so fine. On the other hand, when etching the portion where the width of the opening 14 is smaller than the thickness $t_0$ of the metallic plate 11 like the inner portions 3a of the inner leads having a small pitch, the exposed surfaces of the metallic plate 11 are not satisfactorily contacted with the active etchant, and only a part of the total amount to be etched in the direction of plate thickness is etched. This is attributable to a lowering of the etching ability due to the fact that the etchant is not sufficiently circulated and the deteriorated etchant resides in the etched portions. For that reason, the plate cannot be pierced by etching alone to define the inner portions 3a of the inner leads having a small pitch, and a shallow recess is only formed in the opening. In this embodiment, therefore, a laser beam is irradiated to such a recess so that the plate is pierced there for complete processing. The etching process and the subsequent laser cutting in the above case will be described below.

Figure 24A:
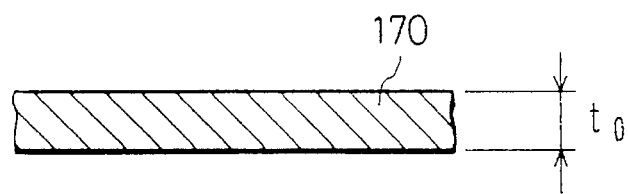
FIG. 24A shows a section of a metallic plate to be processed.
Figure 24B:
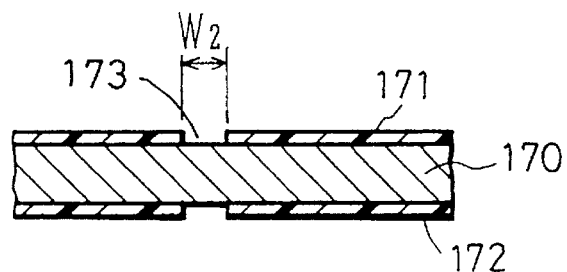
FIG. 24B shows the condition that resist films in a predetermined pattern are formed on the plate.
Figure 24C:
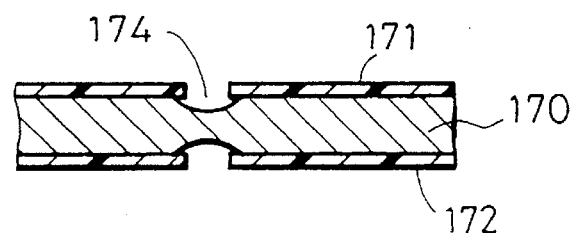
FIG. 24C shows the condition that recesses are formed in the plate by etching.
Figure 24D:
FIG. 24D shows the condition that the resist films are removed.

First, as shown in FIG. 24A, resist films 171, 172 in a predetermined pattern, shown in FIG. 24B, are formed on both sides of a metallic plate 170 having a predetermined thickness $t_0$ in a like manner to that previously described with reference to FIG. 3. At this time, openings 173 in the resist films 171, 172 have a width $W_2$ smaller than the thickness $t_0$ of a metallic plate 170. Then, the openings 173 in the resist films 171, 172 are chemically etched from both sides of the metallic plate 170 as shown in FIG. 24C. As described above, however, there is formed not a throughhole but a shallow recesses 174 in the openings 173. After that, as shown in FIG. 24D, the resist films 171, 172 coated over both sides of the metallic plate 170 are removed. The above process may be carried out at the same time as etching the outer leads and the outer portions of the inner leads.

Figure 24E:
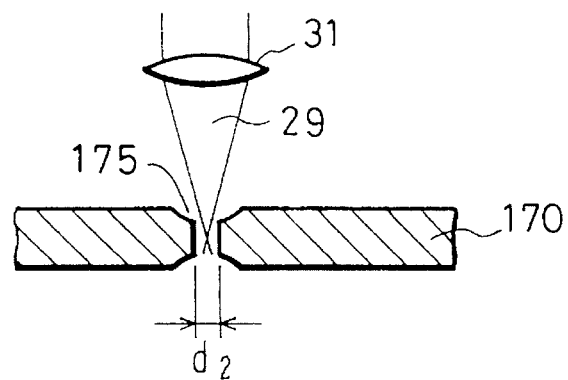
FIG. 24E shows the condition that the recessed portion is subject to laser cutting to pierce the plate.

Next, as shown in FIG. 24E, a laser beam 29 condensed by a condensing lens 31 is irradiated to the center of one recess 174 in the metallic plate 170 etched as above, whereby the plate is pierced at the recesses 174 in the direction of plate thickness to form a through-hole 175 having an opening width $d_2$. At this time, since the laser beam can be irradiated by utilizing the recess 174 as a guide mark, the laser cutting can be performed with easy positioning between the laser beam and the cut position. A predetermined pattern is formed by continuing the laser cutting while moving the condensed position of the laser beam 29. Also, since the thickness of the metallic plate 170 at locations to be laser-cut becomes thinner, the amount of dross generated with the laser cutting is reduced and the dross is deposited in the recesses 174. Accordingly, the dross is prevented from projecting from the surfaces of the lead frame and a reduction in accuracy of the plate thickness can be avoided.

In this embodiment, too, the laser cutting is performed under the condition that the joint portion is left so as to interconnect the inner portions 3a of the inner leads are at their inner distal ends. Therefore, since the laser cutting is performed under the condition that the inner portions 3a of the inner leads are not disconnected from one another, the occurrence of thermal deformations incidental to the laser cutting is suppressed and the inner leads are prevented from being curved or so in the plate plane. The joint portion is finally cut off by laser cutting as with the above embodiment described with reference to FIGS. 1 to 19.

The processing method other than the foregoing is similar to that in the embodiment previously described with reference to FIGS. 1 to 19.

Thus, this embodiment can provide not only similar advantages to those in the above embodiment, but also an additional advantage of easily positioning the locations to be laser-cut with respect to the laser beam because those locations are etched before the laser cutting. Further, since the plate thickness at the locations to be laser-cut becomes thinner, the amount of dross generated with the laser cutting is reduced and the dross is deposited in the recesses 174. As a result, the dross is prevented from projecting from the surfaces of the lead frame and a reduction in accuracy of the plate thickness can be avoided.

SIXTH EMBODIMENT

A sixth embodiment of the present invention will be described below with reference to FIGS. 25 to 29.

Figure 25A:
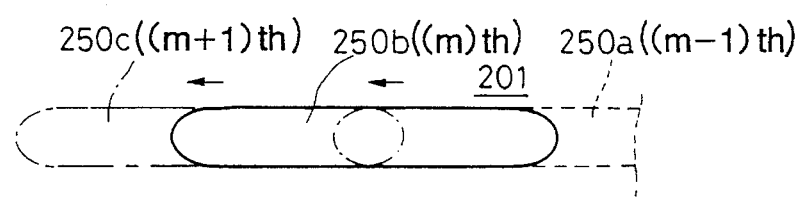
FIGS. 25A and 25B shows the condition of a metallic plate under processing.
Figure 25B:
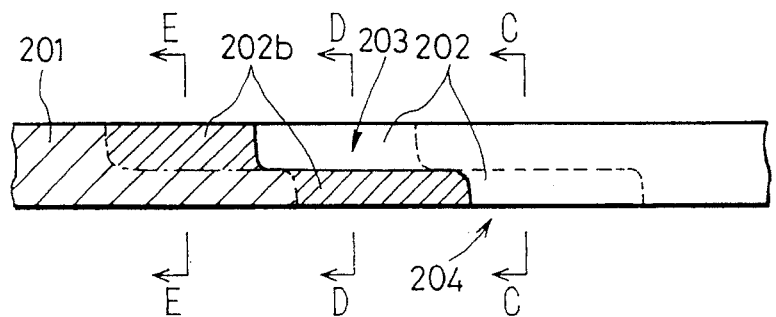

In this embodiment, a laser beam 250 condensed to the metallic plate is elongate in cross-section as shown in FIG. 25A, and its energy density is substantially uniform in the cross-section of the beam. Also, the energy density of the laser beam is selected to such an extent that the metallic plate cannot be pierced therethrough in the direction of thickness thereof by one pulse and, as shown in FIG. 25B, about a half or more of the thickness of the metallic plate 201 is cut by irradiation of one-pulse laser beam. The energy density of the laser beam is preset depending on the material, thickness and so on of the metallic plate 201 to be processed.

Laser cutting is carried out by employing such an elongate laser beam and setting the lengthwise direction of the elongate laser beam to be coincident with the direction in which the cutting is advanced (indicated by arrows), as shown in FIG. 25A. Then, the laser cutting is progressed successively while overlapping ½ or more of the area irradiated by the laser beam with each other in the lengthwise direction thereof. Specifically, in FIG. 25A, a laser beam 250b of the m-th pulse is irradiated to the area having been irradiated by a laser beam 250a of the (m−1)-th pulse such that the laser beam 250b is overlapped with ½ or more of the irradiation area of the laser beam 250a, and a laser beam 250c of the (m+1)-th pulse is irradiated to the area having been irradiated by the laser beam 250b of the m-th pulse such that the laser beam 250c is overlapped with ½ or more of the irradiation area of the laser beam 250b. By so repeating the irradiation, the laser cutting is progressed.

Figure 25C:
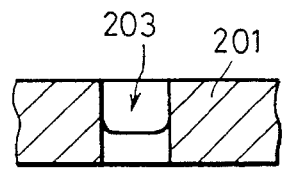
FIGS. 25C, 25D and 25E are sectional views respectively taken along lines C—C, D—D and E—E in FIG. 25B.
Figure 25D:
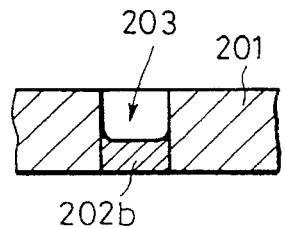
Figure 25E:
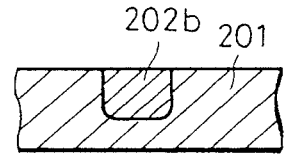

When the laser cutting is performed in this way, an area 202a is removed by the irradiation of the m-th pulse laser beam, and an area 202b is removed by the irradiation of the (m+1)-th pulse laser beam, as shown in a sectional view of FIG. 25B. In other words, even with each laser beam having a uniform energy distribution, a cut portion in the step-like form extending in the direction of plate thickness is successively defined in the metallic plate 210 such that, as shown in FIG. 25B, a groove 203 is formed upstream and a thoroughly cut opening 204 is formed downstream in the direction in which the laser cutting is advanced. Note that FIGS. 25C, 25D and 25E are sectional views respectively taken along lines C—C, D—D and E—E in FIG. 25B.

Figure 26A:
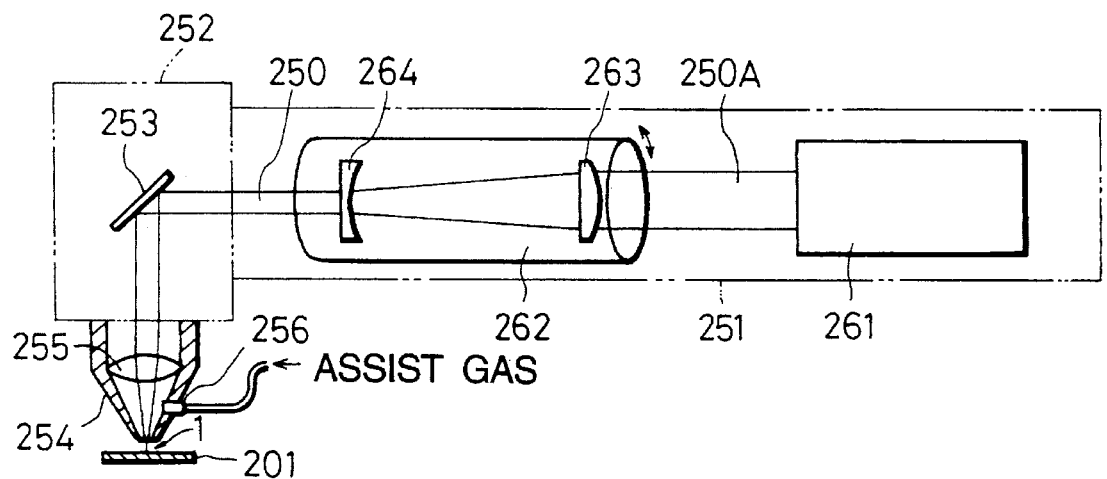
FIG. 26A is a schematic view of an optical system in a laser oscillator, a working head and a nozzle.
Figure 26B:
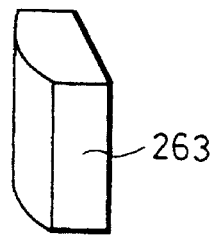
FIG. 26B is a perspective view of a convex cylindrical lens in FIG. 26A.
Figure 26C:
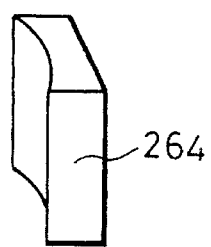
FIG. 26C is a perspective view of a concave cylindrical lens in FIG. 26A.

A description will now be made of a laser cutting apparatus used in this embodiment. FIG. 26A schematically shows an optical system in a laser oscillator, a working head and a nozzle of the laser cutting apparatus used in this embodiment. The laser cutting apparatus used in this embodiment is basically of the same construction as the laser cutting apparatus shown in FIG. 5 except for the laser oscillator. The progress of the laser cutting, i.e., the movement of the metallic plate 201, is effected with the aid of an XY table described in connection with FIG. 5.

In FIG. 26A, a laser oscillator 251 includes a laser resonator 261 and a beam size converting unit 262, the working head 252 includes a bending mirror 253, and the nozzle 254 includes a condensing lens 255 and an assist gas supply port 256. The beam size converting unit 262 includes a convex cylindrical lens 263 (see FIG. 26B) and a concave cylindrical lens 264 (see FIG. 26C). The beam size converting unit 262 is entirely rotatable by a drive motor or the like (not shown) through a predetermined angle about an optical axis of a laser beam 250A (250).

The laser beam 250A generated by the laser resonator 261 is first contracted only in one-axis direction of a beam section by the convex cylindrical lens 263 of the beam size converting unit 262, and then modified by the concave cylindrical lens 264 into parallel light. The laser beam 250 exiting from the concave cylindrical lens 264 enters the working head 252, and is changed in direction by the bending mirror 253 so as to enter the condensing lens 255 in the nozzle 254. The laser beam 250 is condensed by the condensing lens 255 to have the predetermined energy density described above, followed by irradiation to the surface of the metallic plate 201. The cross-section of the laser beam 250 irradiated to the metallic plate 201 is elongated into the elliptical form contracted only in one-axis direction with actions of the cylindrical lenses 263, 264, as shown in FIG. 25A. Also, the elliptical laser beam 250 rotates about the optical axis upon rotation of the entire beam size converting unit 262 through the predetermined angle. Further, an assist gas is ejected from an assist gas supply port 256 near a distal end of a nozzle 254 coaxially with the laser beam. Instead of using the optical system as described above, a slab type laser activator may be included in the laser resonator and to employ a slab-like laser beam generated from the laser resonator and having a rectangular cross-section.

Figure 27A:
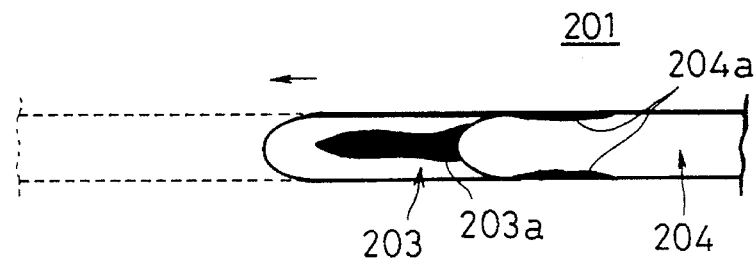
FIG. 27A is a plan view of the metallic plate and FIGS. 27B, 27C and 27C are sectional views of the metallic plate.
Figure 27B:
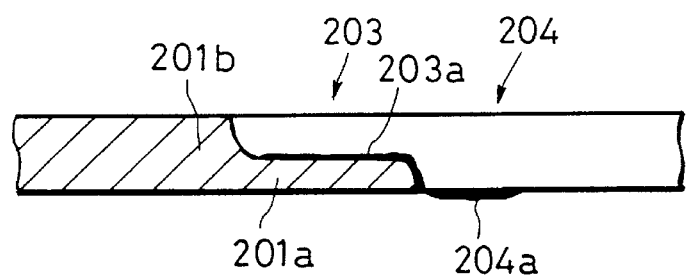
Figure 27C:
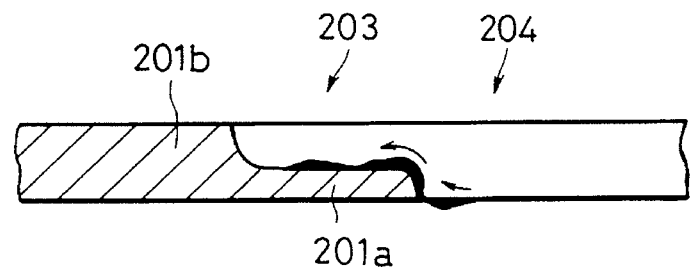
Figure 27D:
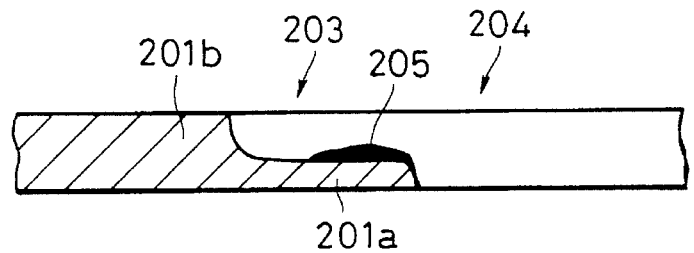

Behavior of molten metal (dross) during the laser cutting performed as above will now be described with reference to FIG. 27. In addition, FIG. 27A is a plan view of the metallic plate 201 which shows the condition during the laser cutting. The groove 203 is formed upstream and the thoroughly cut opening 204 is formed downstream in the direction, indicated by an arrow in the figure, in which the laser cutting is advanced. Most of the molten metal generated with the irradiation of the laser beam is fallen down at the time the metallic plate 201 is pierced and the thoroughly cut opening 204 is formed. As shown in FIGS. 27A and 27B, however, some part of the molten metal remains on the metallic plate 201 to deposit as molten metal 203a on a bottom surface of the groove 203 and as molten metal 204a on the underside of walls of the thoroughly cut opening 204.

Here, the upstream groove 203 in the direction in which the laser cutting is advanced represents a portion where the metallic plate is not pierced in the direction of thickness thereof to remain partly, and where the presence of non-processed portions 201a, 201b under the bottom surface of the groove 203 causes heat to be more easily released than the walls of the downstream thoroughly cut opening 204 where heat releasing areas are small. Accordingly, there occurs a difference in cooling speed between the groove 203 and the thoroughly cut opening 204 such that the temperature of the groove 203 becomes lower. Because the surface tension of molten metal is greater at lower temperatures than at higher temperatures, the molten metal 204a deposited on the underside of walls of the thoroughly cut opening 204 is attracted, as shown in FIG. 4C, toward the groove at lower temperatures due to the difference in surface tension. As a result, the molten metal is collected onto the bottom surface of the upstream groove 203 in the direction in which the laser cutting is advanced and, as shown in FIG. 4D, dross 205 is always deposited on the bottom surface of the groove 203.

Then, when the metal in the groove 203 is molten and cut to fall down upon the next irradiation of the laser beam (see FIG. 25), the dross 205 deposited on the bottom surface of the groove 203 is also molten and fallen down together therewith. The molten metal still remaining at this time behaves in the same manner as described above, and the laser cutting is continued by repetition of the above process. Accordingly, the molten metal generated with the irradiation of the laser beam neither agglomerates into several uneven aggregates nor grows into large masses, meaning that any dross is not deposited on the walls of the thoroughly cut opening. Eventually, even though remains, the dross 205 is only deposited on the bottom surface of the upstream groove 203 in the direction in which the laser cutting is advanced.

Figure 28A:
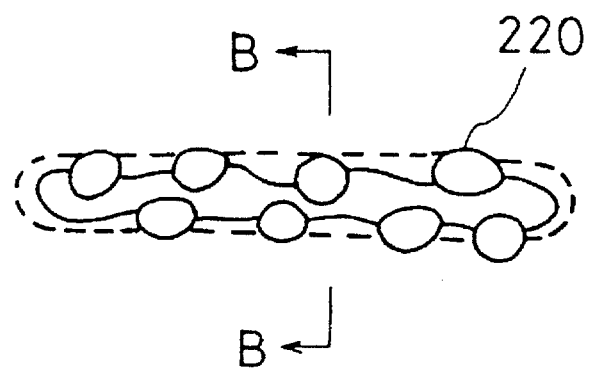
FIG. 28A is a view showing the condition that the metallic plate is pierced through its total thickness by one pulse of laser beam, as viewed from the back side.
Figure 28B:
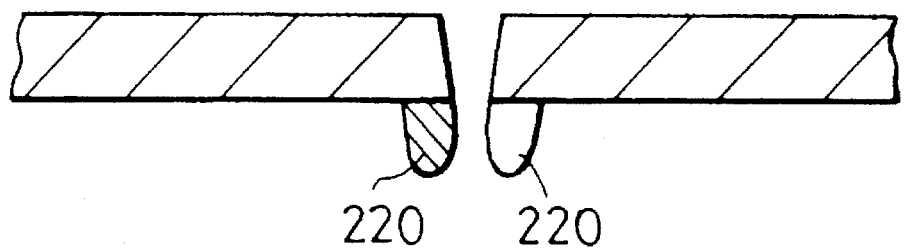
FIG. 28B is a sectional view taken along line B—B in FIG. 28A.

Meanwhile, when a metallic plate is pierced through its total thickness by one pulse of laser beam as conventional, molten metal which has not been fallen down but remained is deposited along the entire length of end faces of a through-hole (gap). The deposited molten metal agglomerates and grows into several uneven aggregates due to the difference in surface tension caused by a slight temperature difference, and is solidified there to produce uneven dross 220, for example, as shown in FIG. 28. The dross 220 tends to deposit on the side of the metallic plate opposite to the side irradiated by the laser beam (i.e., the back side). Note that FIG. 28A is a view as viewed from the side of the metallic plate opposite to the side irradiated by the laser beam (i.e., the back side), a broken line in the figure representing the opening of the through-hole in the front side. Additionally, FIG. 28B is a sectional view taken along line B—B in FIG. 28A.

On the contrary, in this embodiment, since any dross is not deposited on the walls of the thoroughly cut opening after the laser cutting as described above, the inner portions of the inner leads are not affected by the deposited dross after the laser cutting, whereby dimensional accuracy and cleanness can be improved.

Figure 29:
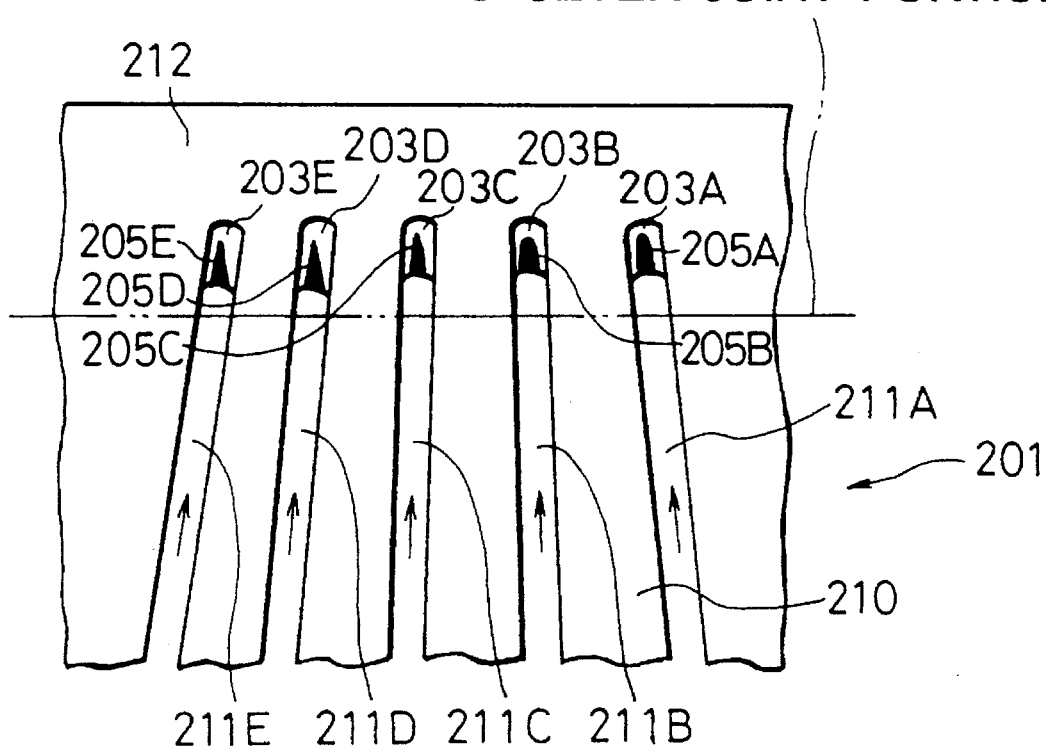
FIG. 29 is a view for explaining a method of processing the inner portions of the inner leads by the laser cutting shown in FIG. 25.

A method of processing the inner portions of the inner leads in this embodiment will now be described with reference to FIG. 29. In FIG. 29, gaps 211A to 211E dividing inner portions 210 of the inner leads individually are formed from the outer side toward the inner side of the inner leads as indicated by arrows in the figure by the laser cutting method described in connection with FIGS. 25 to 27. Also, as with the embodiment described in connection with FIGS. 1 to 19, a joint portion 212 is left so as to interconnect the inner portions 3a of the inner leads at their inner distal ends.

Assuming that the laser cutting is started from the rightmost gap 211A in the figure, at the time of cutting the second gap 211b from the right side, the beam size converting unit 262 described in connection with FIG. 26 is rotated a predetermined angle, i.e., the angle formed between the gaps 211A and 211B, enabling the elliptical beam 250 (see FIG. 25A) to rotate about the optical axis so that the lengthwise direction coincides with the direction in which the laser cutting is advanced. Subsequently, the gaps 211C to 211E are cut in a similar manner. At this time, grooves 203A to 203E are formed in respective dead ends of the gaps 211A to 211E, and molten metal that has been collected as described in connection with FIG. 27 is deposited as pieces of dross 205A to 205E on respective bottom surfaces of the grooves 203A to 203E. Of course, any dross is not deposited on walls of the gaps 211A to 211E after the laser cutting, resulting in good dimensional accuracy and cleanness. Although not shown, other gaps than the gaps 211A to 211E are also formed in a like manner.

The joint 212 is finally cut off by laser cutting as with the embodiment described in connection with FIGS. 1 to 19. The path along which the laser beam is moved to cut off the joint 212 by the laser cutting is indicated by a two-dot-chain line in the figure. Thereby, the inner portions 210 of the inner leads are separated from one another and, simultaneously, the pieces of dross 205A to 205E deposited on the grooves 203A to 203E are also all removed together with the joint portion 212. Thus, since the pieces of dross 205A to 205E are collected to inner end portions of the gaps 211A to 211E and the joint portion 212 is finally cut off including the pieces of dross 205A to 205E, the shape of the inner portions 210 of the inner leads are kept satisfactory not only in their intermediate areas, but also in their distal end areas.

The processing method other than the foregoing is similar to that in the embodiment previously described with reference to FIGS. 1 to 19.

This embodiment constructed as above can provide not only similar advantages to those in the embodiment described with reference to FIGS. 1 to 19, but also additional advantages below.

First, since the laser beam 250 being elongate in cross-section is employed and the lengthwise direction of the laser beam 250 is made coincident with the direction in which the laser cutting is advanced, high-speed laser cutting can be realized.

Further, since the energy density of the laser beam is selected to such an extent that the metallic plate cannot be pierced therethrough in the direction of thickness thereof by one pulse and the laser cutting is performed while shifting the irradiation position of the laser beam 250 successively such that the area irradiated by the laser beam of every one pulse is overlapped with each other through a predetermined length, the step-like processed portion is formed successively and the generated dross 205 is always deposited on the bottom surface of the upstream groove 203 in the direction in which the laser cutting is advanced. Accordingly, the molten metal generated with the irradiation of the laser beam neither agglomerates into several uneven aggregates nor grows into large masses, resulting in that the inner portions 210 of the inner leads are not affected by the deposited dross, whereby dimensional accuracy and cleanness can be improved.

Moreover, since when laser-cutting the inner leads, the cutting is advanced from the outer side toward the inner side of the inner leads 210 and the joint portion 212 is left so as to interconnect the inner portions 3a of the inner leads at their inner distal ends, the pieces of dross 203A to 203E are collected and deposited on the bottom surfaces of the groove 203A to 203E at the dead ends of the gaps 211A to 211E. Therefore, by finally cutting off the inner distal ends of the inner leads at near the joint portion 212, the pieces of dross 205A to 205E deposited on the grooves 203A to 203E can be all removed together.

INDUSTRIAL APPLICABILITY

According to the present invention, since the inner portions of the inner leads are formed by laser cutting under the condition that the joint portion is left so as to interconnect the inner leads at their inner distal ends, the occurrence of thermal deformations incidental to the laser cutting is suppressed and the inner leads are prevented from being curved or so in the plate plane, whereby highly accurate processing is ensured.

Also, since the formation of the outer portions of the inner leads and the outer leads, and other processing required to form the lead frame are performed under the condition that the inner leads are mutually fixed and restricted by the joint portion and hence the rigidity is maintained, the inner leads are prevented from being disordered in their array, making it possible to facilitate handling of the lead frame and to maintain the dimensional accuracy thereof.

Since foreign matters such as dross are removed by the mechanical surface treatment and the chemical surface treatment, the surfaces of the inner leads can be made clean. Further, since the plated terminal portions of metal having a good conductivity are formed on the surfaces of the inner leads in clean condition, the satisfactory plated terminal portions having good adhesion can be obtained.

In addition, the surfaces of the plated terminal portions are protected by coating the protective film over at least the plated terminal portions. Then, by removing the protective film after cutting off the joint portion, the dirt and so on deposited on the protective film can be all removed together.

Since a laser beam is utilized to cut off the joint portion, the joint portion can be easily cut off with high accuracy.

Since both processing methods, i.e., non-thermal processing such as etching or punching by a press and the laser cutting as thermal processing are combined with each other depending on the portion to be processed, the highly accurate lead frame can be processed with high efficiency.

Further, since a laser beam being elongate in cross-section is employed and the lengthwise direction of the elongate laser beam is made coincident with the direction in which the laser cutting is advanced, high-speed laser cutting can be realized. Moreover, since the energy density of the laser beam is selected to such an extent that the metallic plate cannot be pierced therethrough in the direction of plate thickness by one pulse and the laser cutting is performed while shifting the laser beam successively such that the area irradiated by the laser beam of every one pulse is overlapped with each other through a predetermined length, the inner leads are not affected by the deposited dross, making it possible to improve dimensional accuracy and cleanness.

Additionally, with the present invention, since the lead frame having a small pitch can be processed with high accuracy, it is possible to further reduce the size of semiconductor devices and to increase a degree of integration and density thereof, by making use of such a feature.

We claim:

1. A lead frame processing method in which a metallic plate (11) is subject to laser cutting to form a lead frame (1) comprising a number of inner leads (3) and a number of outer leads (4) positioned outwardly of said inner leads in continuous relation, wherein the number of inner leads (3) is sufficiently great and of sufficiently small pitch so as to be subjected to thermal deformation forces when inner portions (3a) of the inner leads (3) are formed by laser cutting, said method comprises the steps of:

(a) forming the inner portions (3a) of said inner leads by said laser cutting under the condition that a joint portion (7) is left so as to interconnect said inner leads (3) at their distal ends in order to prevent thermal deformation forces incidental to said laser cutting from deforming said inner leads (3), (b) forming outer portions (3b) of said inner leads and said outer leads (4), and (c) cutting off said joint portion (7) to complete said inner leads (3).

2. A lead frame processing method according to claim 1, wherein step (c) is performed after step (b).

3. A lead frame processing method according to claim 1, further comprising, before step (c), a step (d) of removing melting and solidifying matters such as dross (10) generated with said laser cutting step (a).

4. A lead frame processing method according to claim 3, wherein step (d) includes a step of applying mechanical surface treatment to surfaces of said lead frame (1).

5. A lead frame processing method according to claim 3, wherein step (d) includes a step of applying chemical polishing or electrolytic polishing to surfaces of said lead frame (1).

6. A lead frame processing method according to claim 1, further comprising, before step (c), a step (e) of forming plated terminal portions (3A), which are made of metal having a good conductivity and are used for connection to a semiconductor chip, at the distal ends of said inner leads (3).

7. A lead frame processing method according to claim 6, further comprising a step (f) of removing melting and solidifying matters, such as dross (10) generated with said laser cutting in step (a), wherein the formation of said plated terminal portions (3A) made of metal having a good conductivity in step (e) is carried out after step (f).

8. A lead frame processing method according to claim 6, further comprising, after step (e), a step (g) of coating a protective film over at least said plated terminal portions (3A), said protective film being removed after step (c).

9. A lead frame processing method according to claim 1, further comprising, before step (c), a step (h) of plating said outer leads (4) with solder.

10. A lead frame processing method according to claim 9, wherein step (h) is carried out after coating a protective film for solder plating in the region where the solder plating is not applied, said protective film for solder plating being removed after step (c).

11. A lead frame processing method according to claim 1, wherein step (c) is a step of cutting off said joint portion (7) by laser cutting.

12. A lead frame processing method according to claim 1, wherein step (b) is an etching process.

13. A lead frame processing method according to claim 1, wherein step (b) is a punching process by a press.

14. A lead frame processing method according to claim 1, wherein step (b) is carried out before step (a).

15. A lead frame processing method according to claim 1, wherein step (b) is carried out after step (a).

16. A lead frame processing method according to claim 1, further comprising, before step (a), a step (i) of processing the inner portions (3a) of said inner leads through only a part of the plate thickness by an etching process, wherein the partly processed inner portions (3a) of said inner leads are pierced through a remaining part of the plate thickness by the laser cutting in step (a).

17. A lead frame processing method according to claim 1, wherein the laser cutting in step (a) is carried out by employing a laser beam (250) being elongate in cross-section and having an energy density selected so as to be insufficient to pierce entirely through the thickness of the plate with one pulse, by setting a lengthwise direction of the cross section of said laser beam to be coincident with the direction in which the laser cutting is advanced, and by irradiating the laser beams (250, 250a, 250b, 250c) while shifting said laser beams successively in a direction in which the laser cutting is advanced such that the area irradiated by the laser beam of every one pulse is overlapped with each other through a predetermined length.

18. A lead frame processing method according to claim 17, wherein the laser cutting for forming the inner portions (3a) of said inner leads is carried out to advance from the outer side to the inner side of said lead frame (1).

19. A lead frame processing method in which a lead frame (1) is formed comprising a number of inner leads (3) and a number of outer leads (4) positioned outwardly of said inner leads in continuous relation, wherein said method comprises:

(a) forming inner portions (3a) of said inner leads by laser cutting under the condition that a joint portion (7) is left so as to interconnect said inner leads (3) at their distal ends, (b) forming outer portions (3b) of said inner leads and said outer leads (4), (c) cutting off said joint portion (7) to complete said inner leads (3), and wherein the laser cutting in step (a) is carried out by employing a laser beam (250) being elongate in cross-section and having an energy density selected so as to be insufficient to pierce entirely through the thickness of the plate with one pulse, by setting a lengthwise direction of the cross section of said laser beam to be coincident with the direction in which the laser cutting is advanced, and by irradiating the laser beams (250, 250a, 250b, 250c) while shifting said laser beams successively in a direction in which the laser cutting is advanced such that the area irradiated by the laser beam of every one pulse is overlapped with each other through a predetermined length.

20. A lead frame processing method according to claim 19, wherein the laser cutting for forming the inner portions (3a) of said inner leads is carried out to advance from the outer side to the inner side of said lead frame (1).

* * * * *